(12) United States Patent
Inuzuka

(10) Patent No.: US 12,731,645 B2
(45) Date of Patent: Sep. 8, 2026

(54) SEMICONDUCTOR MEMORY DEVICE WITH REDUCED WRITE VOLTAGE USING CHANNEL FLOATING AND CAPACITIVE COUPLING

(71) Applicant: Kioxia Corporation, Tokyo (JP)

(72) Inventor: Yuki Inuzuka, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 154 days.

(21) Appl. No.: 18/743,500

(22) Filed: Jun. 14, 2024

(65) Prior Publication Data

US 2025/0232814 A1 Jul. 17, 2025

(30) Foreign Application Priority Data

Jan. 15, 2024 (JP) ................................ 2024-004046

(51) Int. Cl.

| | |
|---|---|
| ***G11C 7/00*** | (2006.01) |
| ***G11C 16/04*** | (2006.01) |
| ***G11C 16/08*** | (2006.01) |
| ***G11C 16/10*** | (2006.01) |
| ***G11C 16/34*** | (2006.01) |

(52) U.S. Cl.

CPC ........ *G11C 16/102* (2013.01); *G11C 16/0483* (2013.01); *G11C 16/08* (2013.01); *G11C 16/3404* (2013.01)

(58) Field of Classification Search

CPC ... G11C 16/102; G11C 16/0483; G11C 16/08; G11C 16/3404

USPC .................................................. 365/189.011

See application file for complete search history.

(56) References Cited

U.S. PATENT DOCUMENTS

| | | | | |
|---|---|---|---|---|
| 7,511,996 | B2 * | 3/2009 | Kim | G11C 16/3418 365/185.28 |
| 10,409,499 | B2 * | 9/2019 | Kimura | G11C 16/10 |
| 2017/0255410 | A1 | 9/2017 | Shiga et al. | |
| 2020/0043549 | A1 | 2/2020 | Shibata et al. | |

FOREIGN PATENT DOCUMENTS

| | | |
|---|---|---|
| JP | 2020-024774 A | 2/2020 |

* cited by examiner

*Primary Examiner* — Tha-O H Bui
(74) *Attorney, Agent, or Firm* — XSENSUS LLP

(57) ABSTRACT

A semiconductor memory device including: circuitry configured to perform control to cause a channel of a first memory string including a first memory cell and a second memory cell connected in series to be in a floating state in which the channel is electrically insulated from a first bit line connected to a first end of the first memory string and a source line connected to a second end of the first memory string while applying a write voltage to a first word line connected to a gate of the first memory cell; and decrease a voltage of a second word line connected to a gate of the second memory cell from a first voltage that is less than the write voltage to a second voltage that is less than the first voltage after placing the channel of the first memory string into the floating state.

20 Claims, 16 Drawing Sheets

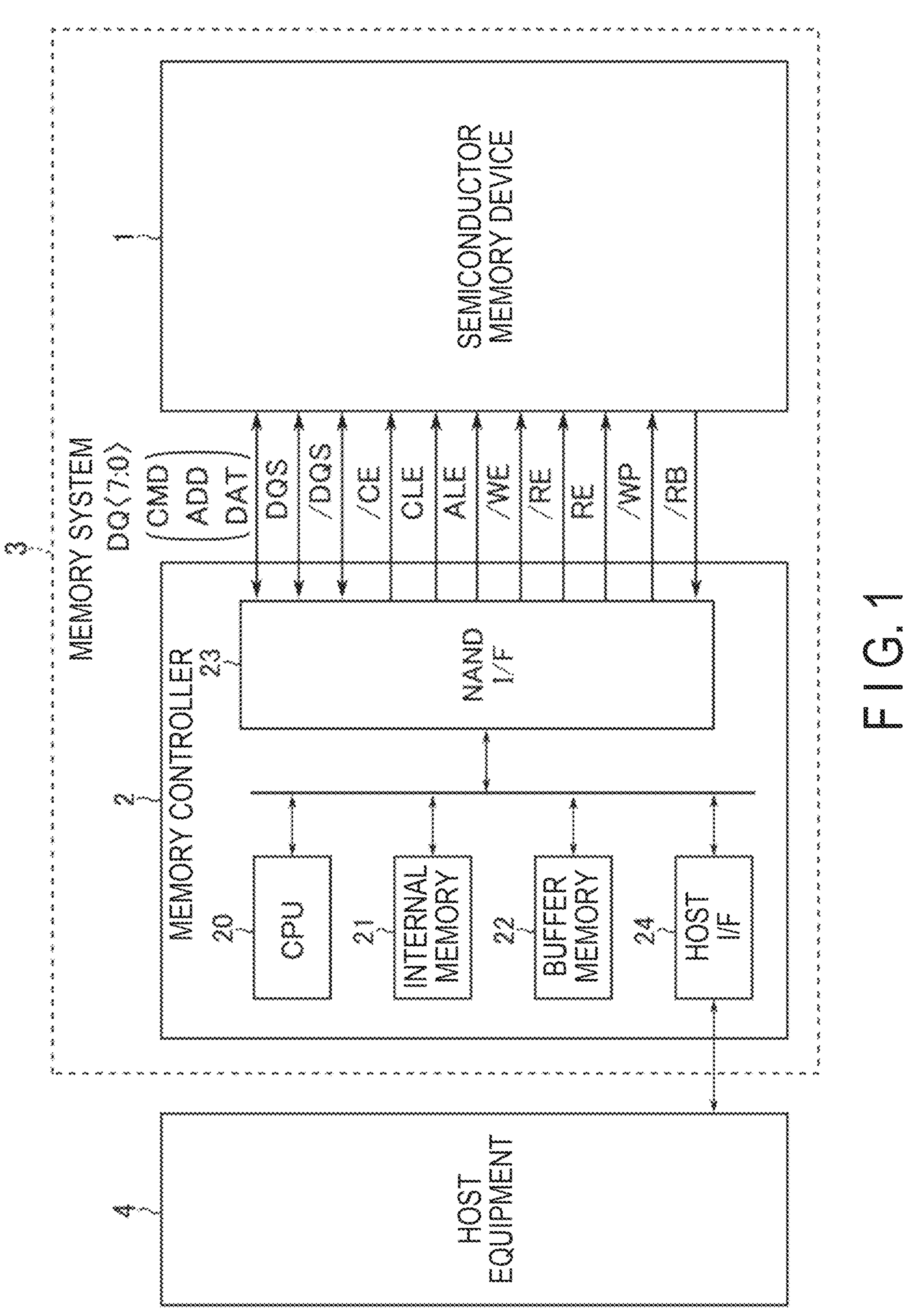
F I G. 1

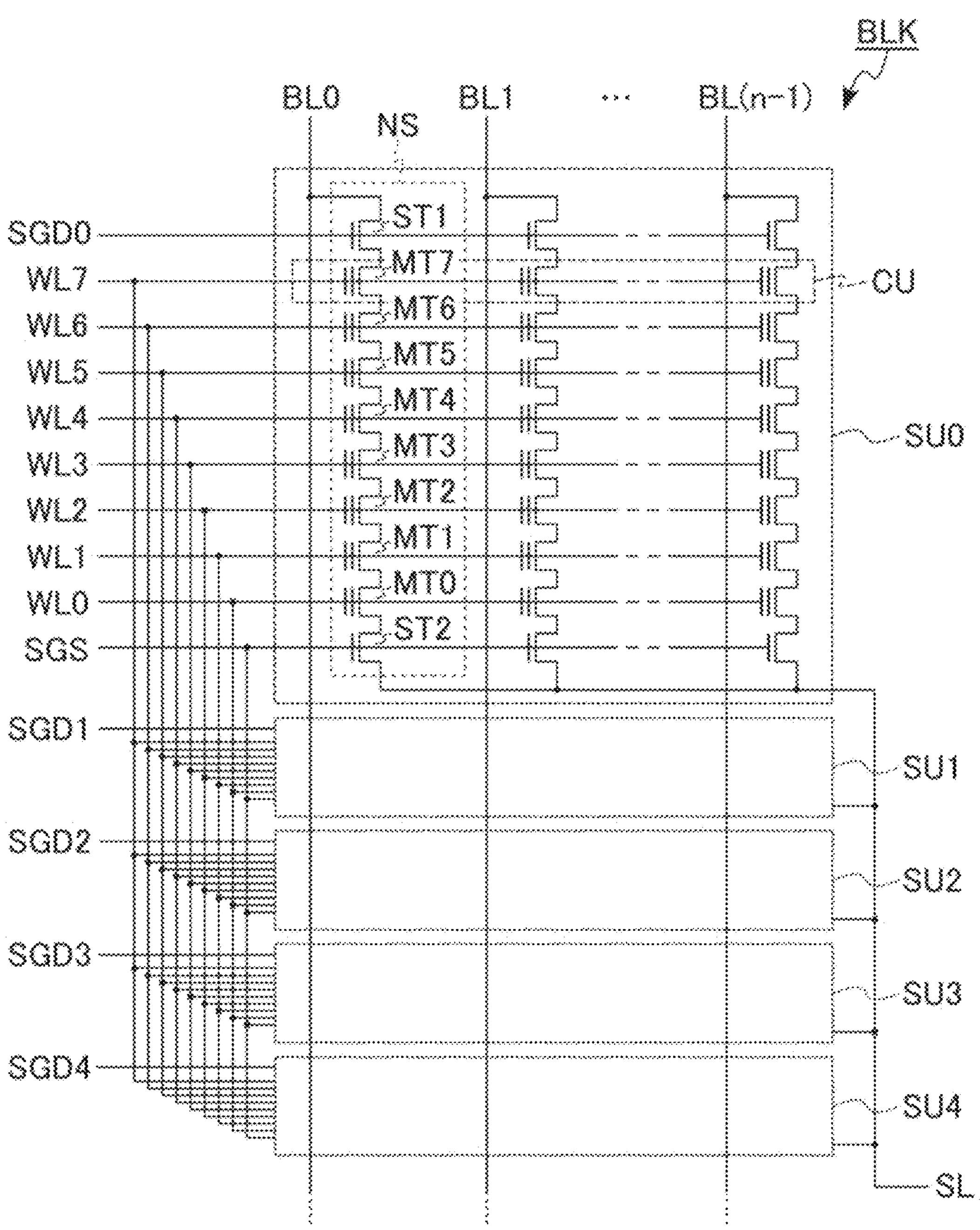
F I G. 3

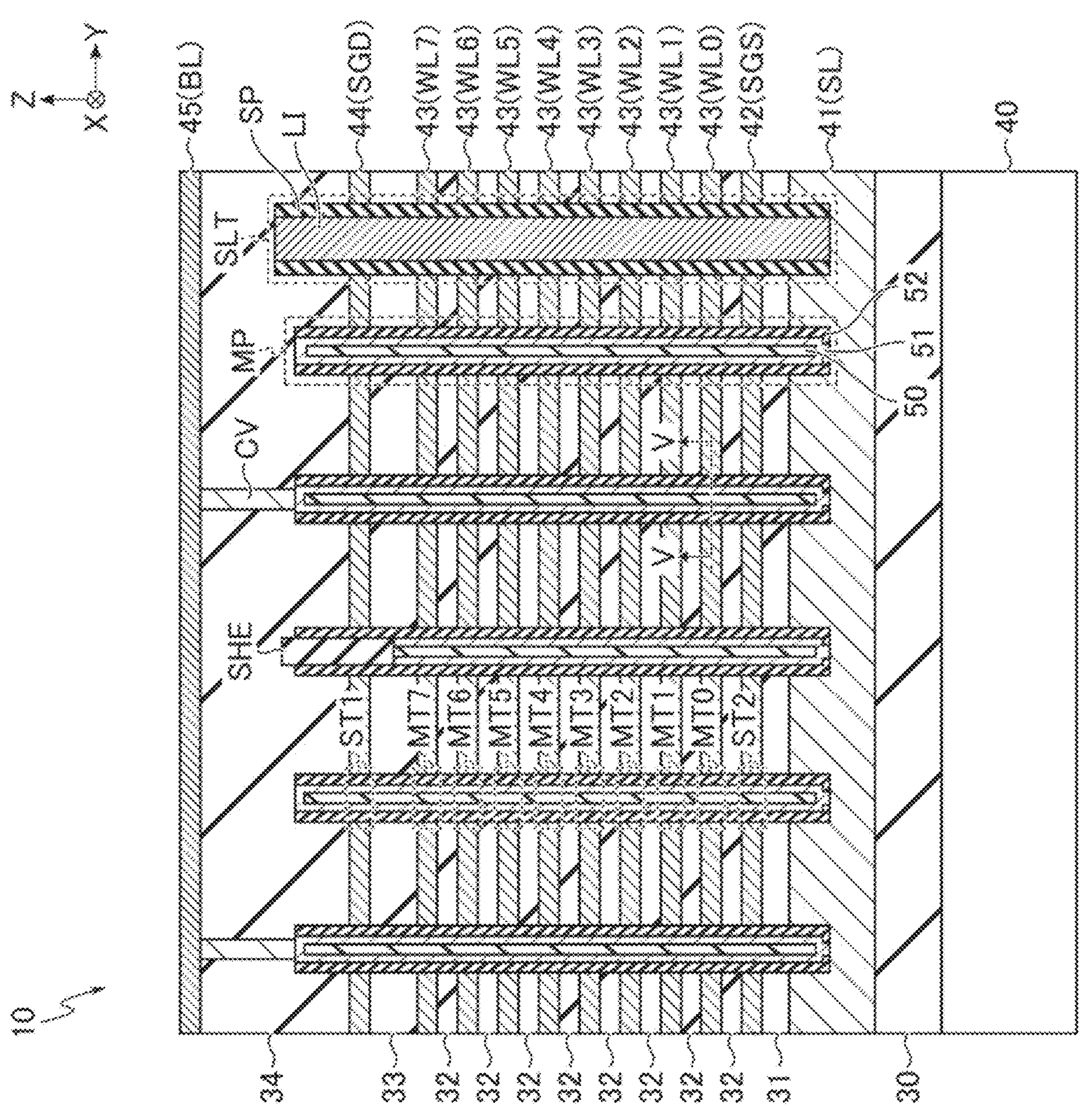
F I G. 4

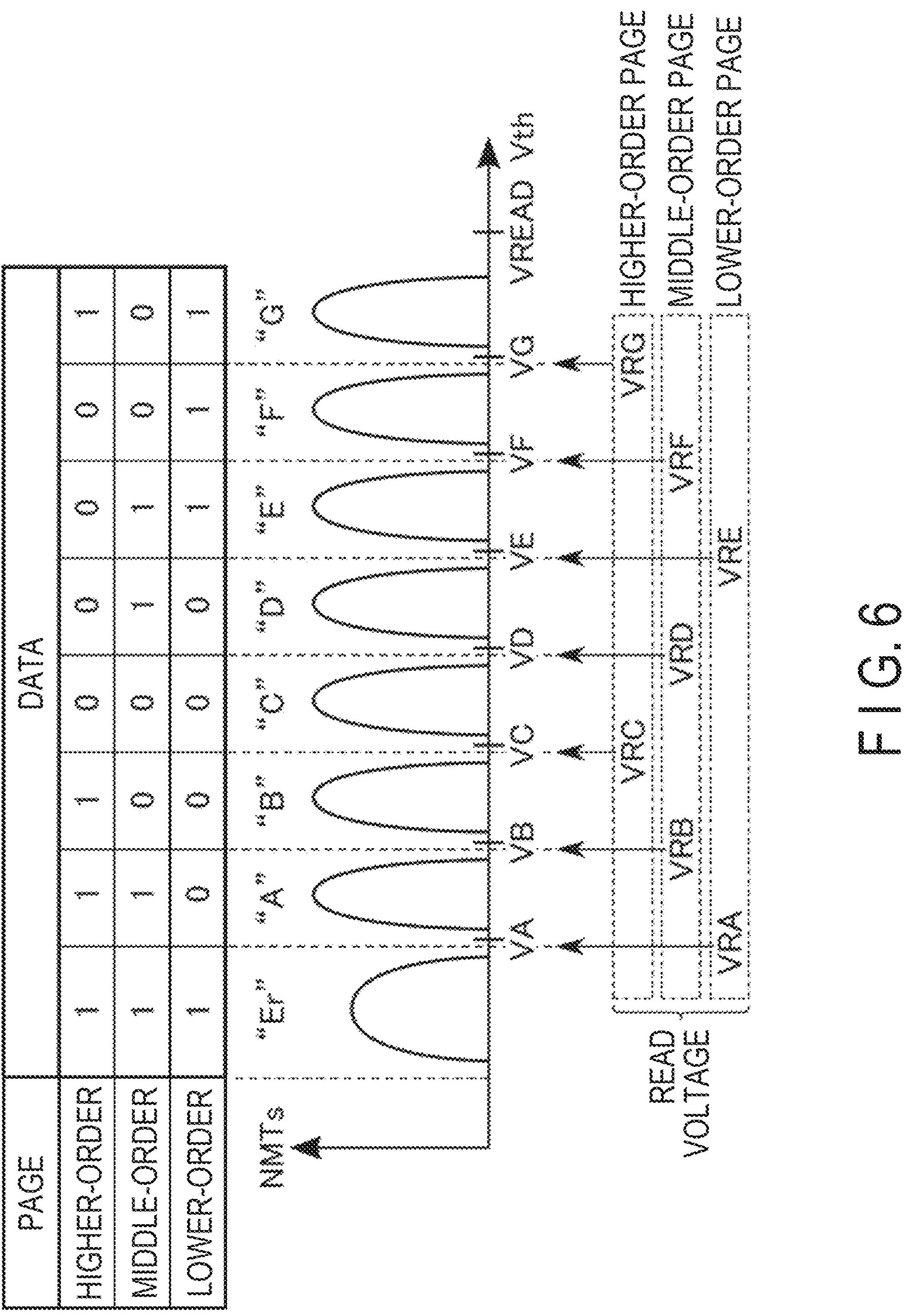
| PAGE | DATA | | | | | | | |
|---|---|---|---|---|---|---|---|---|
| HIGHER-ORDER | 1 | 1 | 1 | 0 | 0 | 0 | 0 | 1 |
| MIDDLE-ORDER | 1 | 1 | 0 | 0 | 1 | 1 | 0 | 0 |
| LOWER-ORDER | 1 | 0 | 0 | 0 | 0 | 1 | 1 | 1 |
F I G. 6

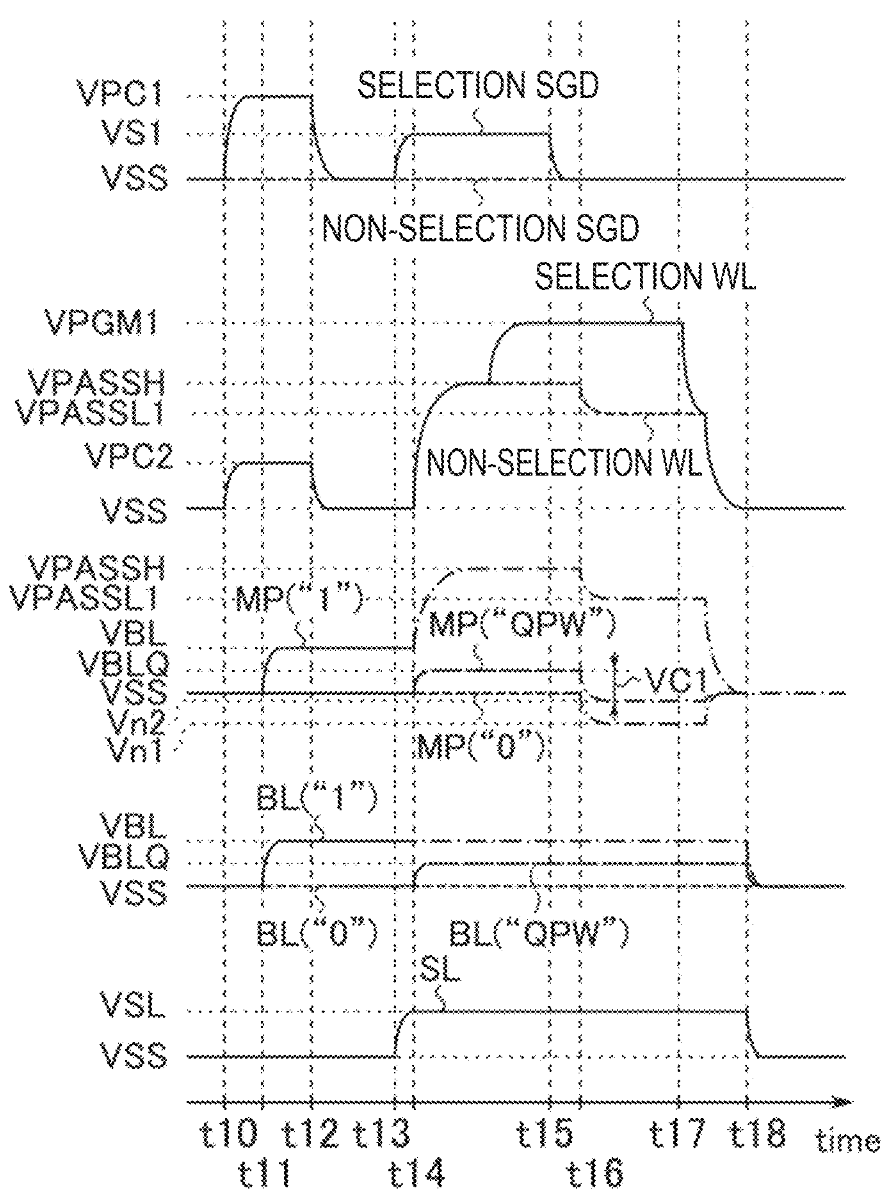
F I G. 11

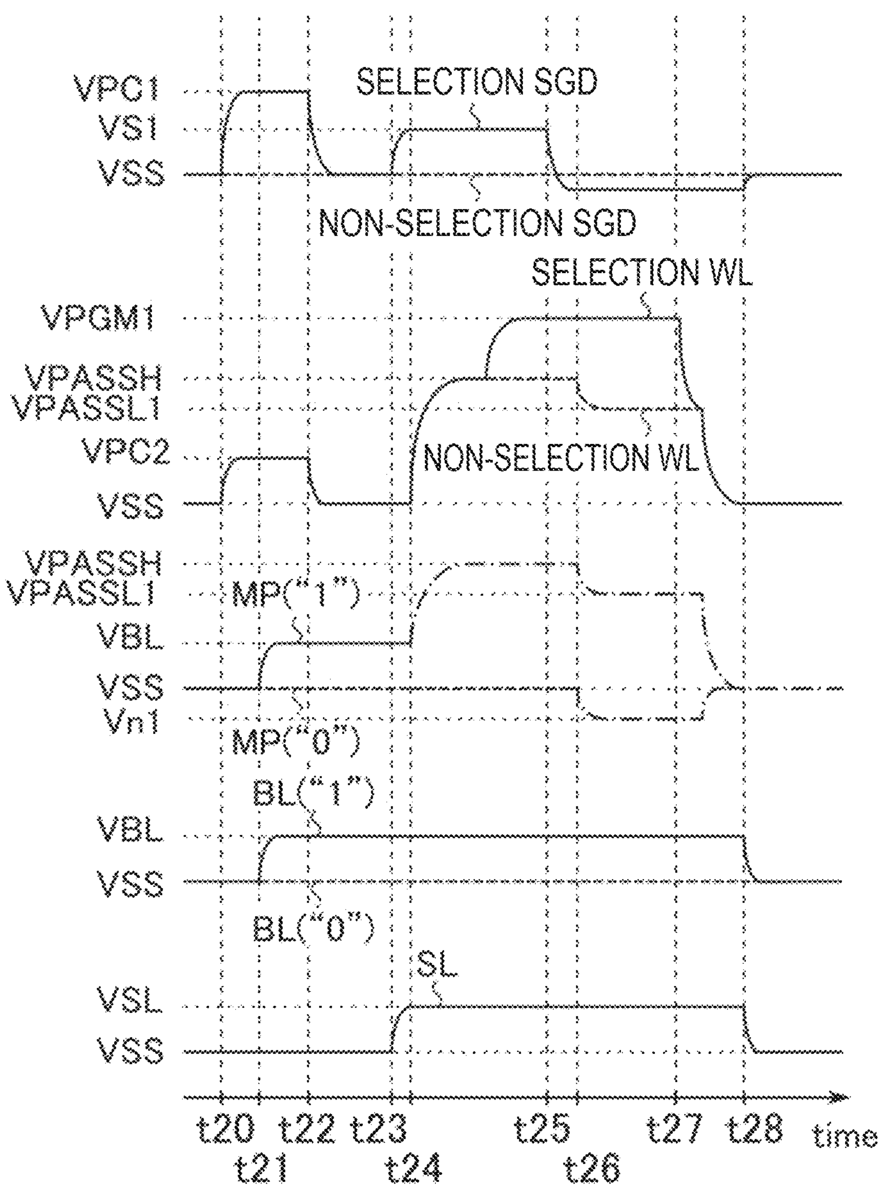
F I G. 12

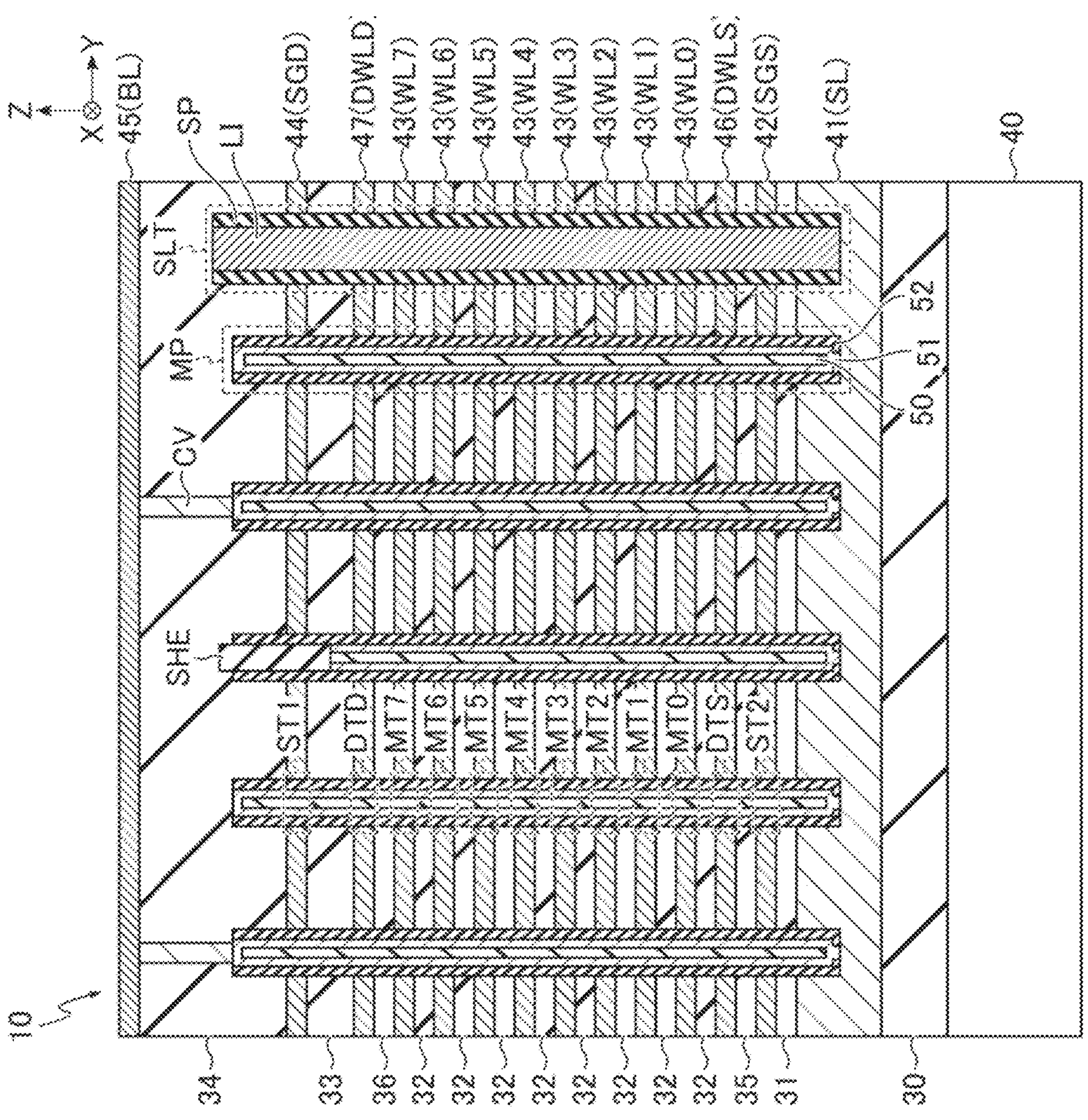
F I G. 15

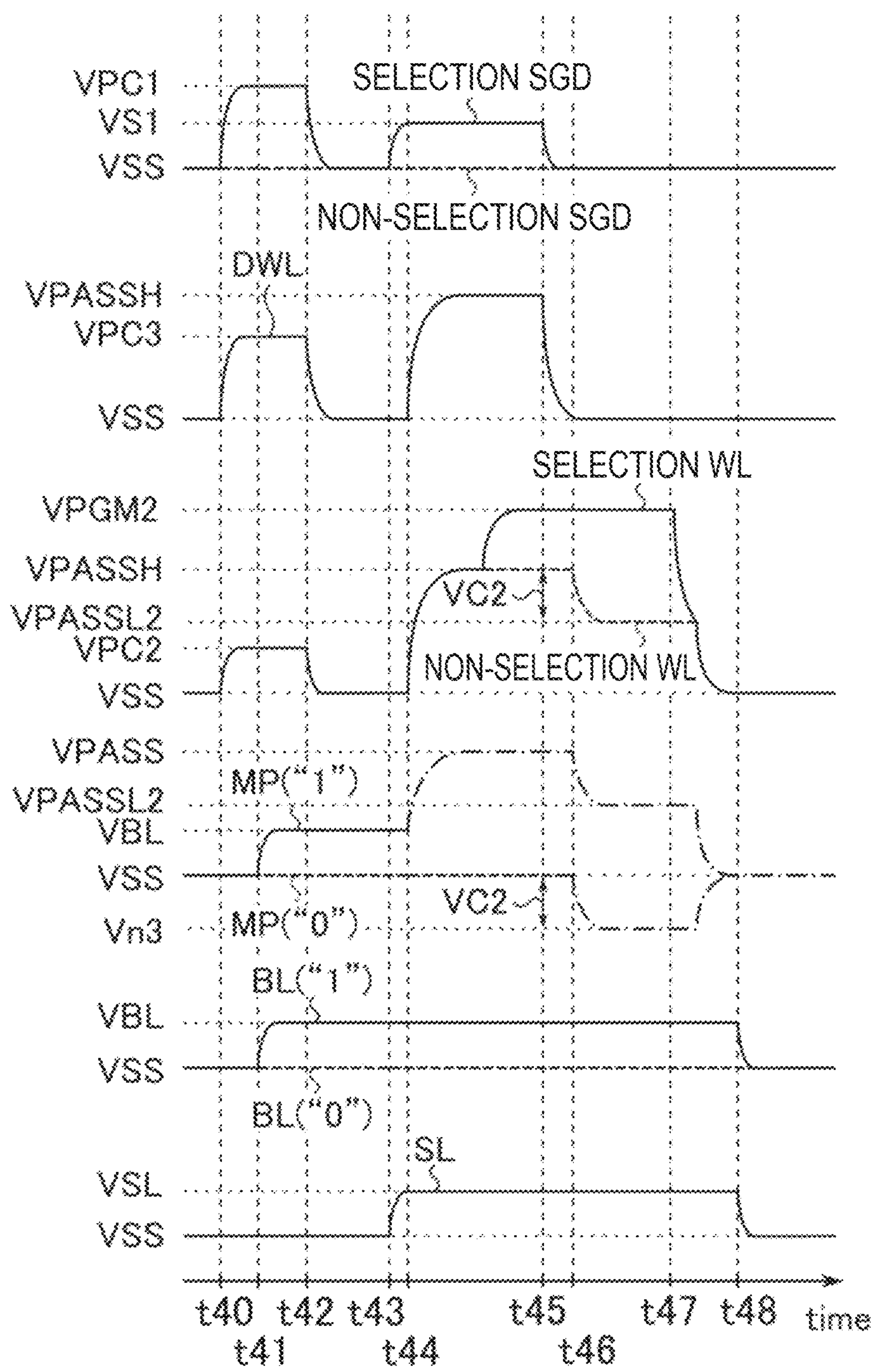
F I G. 17

SEMICONDUCTOR MEMORY DEVICE WITH REDUCED WRITE VOLTAGE USING CHANNEL FLOATING AND CAPACITIVE COUPLING

CROSS-REFERENCE TO RELATED APPLICATION

This application is based upon and claims the benefit of priority from Japanese Patent Application No. 2024-004046, filed Jan. 15, 2024, the entire contents of which are incorporated herein by reference.

FIELD

Embodiments described herein relate generally to a semiconductor memory device.

BACKGROUND

A NAND-type flash memory is known as a semiconductor memory device. The present disclosure relates to a NAND-type flash memory configuration that prevents an increase in write voltage.

BRIEF DESCRIPTION OF THE DRAWINGS

FIG. 1 is a block diagram illustrating one example of configurations of a memory system including a semiconductor memory device according to a first embodiment, and host equipment.

FIG. 3 is a circuit diagram for explaining one example of a configuration of a memory cell array of the semiconductor memory device according to the first embodiment.

FIG. 4 is a cross-sectional view for explaining one example of a structure of the memory cell array of the semiconductor memory device according to the first embodiment.

FIG. 6 is a schematic view indicating one example of threshold voltage distribution of memory cell transistors included in the memory cell array of the semiconductor memory device according to the first embodiment.

FIG. 11 is a timing chart indicating one example of voltages of a source line, a bit line, a channel of a memory pillar, a word line, and a selection gate line during the program operation in the write operation using the semiconductor memory device according to the first modification of the first embodiment.

FIG. 12 is a timing chart indicating one example of voltages of a source line, a bit line, a channel of a memory pillar, a word line, and a selection gate line during program operation in write operation using a semiconductor memory device according to a second modification of the first embodiment.

FIG. 15 is a cross-sectional view for explaining one example of a structure of the memory cell array of the semiconductor memory device according to the second embodiment.

FIG. 17 is a timing chart indicating one example of voltages of a source line, a bit line, a channel of a memory pillar, a word line, a dummy word line, and a selection gate line during program operation in write operation using the semiconductor memory device according to the second embodiment.

DETAILED DESCRIPTION

Figure 2:
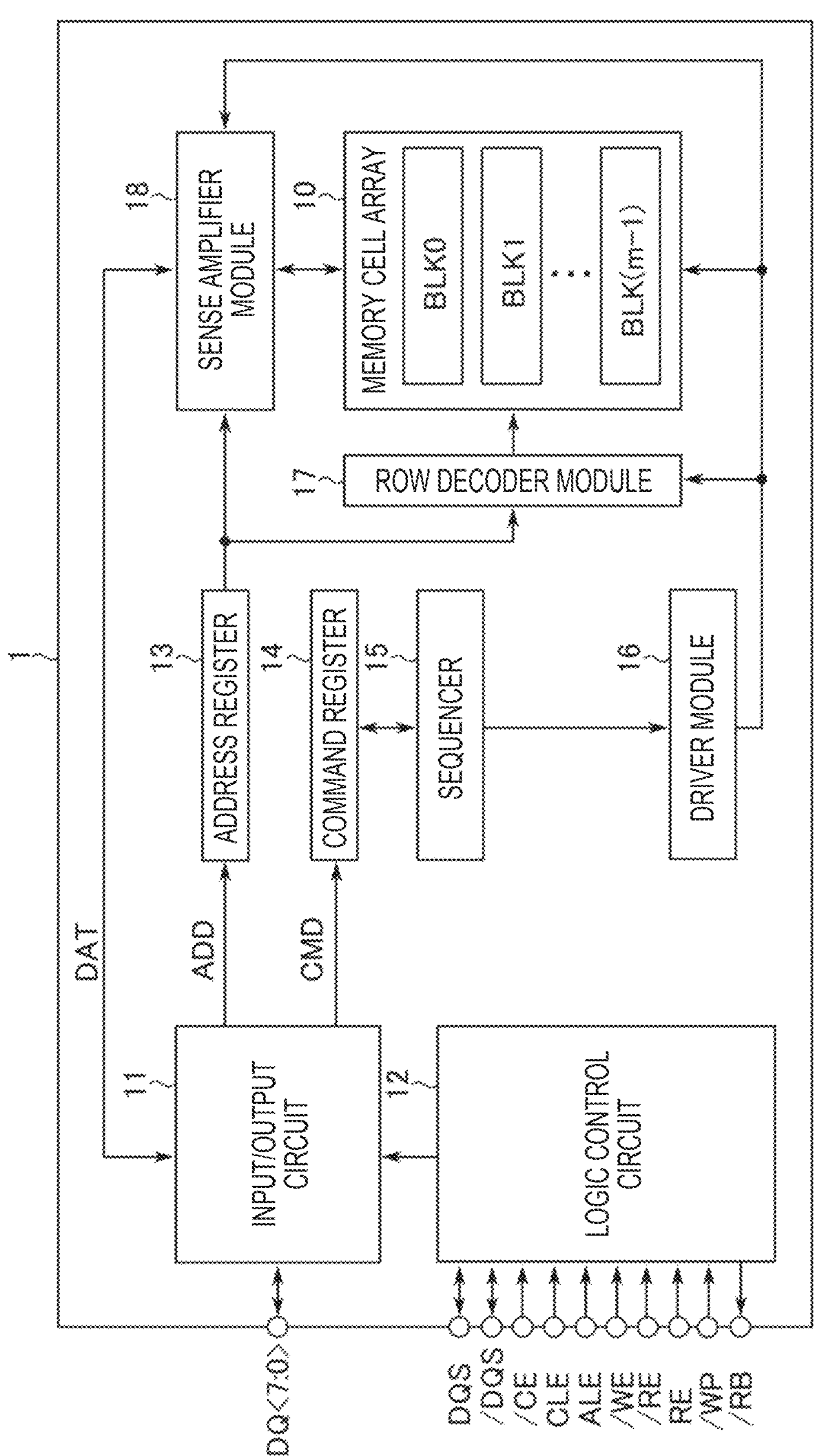
FIG. 2 is a block diagram illustrating one example of a configuration of the semiconductor memory device according to the first embodiment.

In general, according to one embodiment, a semiconductor memory device includes: a first memory string in which a plurality of memory cells including a first memory cell and a second memory cell are connected in series; a first word line connected to a gate of the first memory cell; a second word line connected to a gate of the second memory cell; a first bit line connected to a first end of the first memory string; a source line connected to a second end of the first memory string; and control circuitry. The control circuitry is configured to, in performing a program operation on the first memory cell place a channel of the first memory string into a floating state in which the channel is electrically insulated from the first bit line and the source line while applying a write voltage to the first word line; and decrease a voltage of the second word line from a first voltage that is less than the write voltage to a second voltage that is less than the first voltage after placing the channel of the first memory string into the floating state.

Various embodiments will be described hereinafter with reference to the accompanying drawings.

Embodiments will be described below with reference to the drawings. Note that in the following description, common reference numerals will be assigned to components having the same functions and configurations.

1. First Embodiment

A semiconductor memory device according to a first embodiment will be described below. A NAND-type flash memory will be described below as an example of the semiconductor memory device.

1.1 Configuration

A configuration of the semiconductor memory device according to the first embodiment will be described.

1.1.1 Memory System

First, a configuration example of a memory system will be described using FIG. 1. FIG. 1 is a block diagram illustrating one example of configurations of the memory system including the semiconductor memory device according to the first embodiment, and host equipment.

A memory system 3, for example, communicates with external host equipment 4. The memory system 3 stores data from the host equipment 4. Further, the memory system 3 reads out data to the host equipment 4. The memory system 3 is, for example, a solid state drive (SSD), an SD™ card, or the like.

The memory system 3 includes a semiconductor memory device 1 and a memory controller 2.

The semiconductor memory device 1 includes a plurality of memory cells and stores data in a non-volatile manner. The semiconductor memory device 1 is connected to the memory controller 2 by a NAND bus.

The NAND bus performs transmission and reception via individual signal lines for each of signals /CE, CLE, ALE, /WE, /RE, RE, /WP, /RB, DQ<7:0>, DQS and/DQS in accordance with a NAND interface. The signal /CE, which is a chip enable signal, is a signal for enabling the semiconductor memory device 1. The signal CLE, which is a command latch enable signal, notifies the semiconductor memory device 1 that the signal DQ<7:0> flowing through the semiconductor memory device 1 is a command while the signal CLE is at a "high (H)" level. The signal ALE, which is an address latch enable signal, notifies the semiconductor memory device 1 that the signal DQ<7:0> flowing through the semiconductor memory device 1 is an address while the signal ALE is at an "H" level. The signal /WE, which is a write enable signal, instructs the semiconductor memory device 1 to capture the signal DQ<7:0>. For example, the signal /WE instructs the semiconductor memory device 1 to capture the signal DQ<7:0> as an address or data at a rising edge of the signal /WE at a single data rate (SDR). Further, the signal /WE instructs the semiconductor memory device 1 to capture the signal DQ<7:0> as a command or an address at a rising edge of the signal /WE at a double data rate (DDR). The signal /RE, which is a read enable signal, instructs the semiconductor memory device 1 to output the signal DQ<7:0>. For example, the signal /RE instructs the semiconductor memory device 1 to output the signal DQ<7:0> as data at a falling edge of the signal /RE at the single data rate. Further, the signal /RE instructs the semiconductor memory device 1 to output the signal DQ<7:0> as data at a falling edge and a rising edge of the signal /RE at the double data rate. The signal RE is a complementary signal of the signal /RE. The signal /WP, which is a write protect signal, instructs the semiconductor memory device 1 to prohibit write and erasure of data. The signal /RB, which is a ready busy signal, indicates whether the semiconductor memory device 1 is in a ready state (state where the semiconductor memory device 1 accepts a command from outside) or in a busy state (state where the semiconductor memory device 1 does not accept a command from outside). The signal DQ<7:0> is, for example, a signal of eight bits. The signal DQS, which is a data strobe signal, is used to control an operation timing of the semiconductor memory device 1 related to the signal DQ<7:0>. For example, the signal DQS instructs the semiconductor memory device 1 to capture the signal DQ<7:0> as data at a falling edge and a rising edge of the signal DQS at the double data rate. Further, the signal DQS is generated on the basis of a falling edge and a rising edge of the signal /RE at the double data rate and output from the semiconductor memory device 1 as data along with the signal DQ<7:0>. The signal /DQS is a complementary signal of the signal DQS.

The signal DQ<7:0> is transmitted/received between the semiconductor memory device 1 and the memory controller 2. The signal DQ<7:0> includes a command CMD, an address ADD, and data DAT. The command CMD includes, for example, a command (erase command) that causes the semiconductor memory device 1 to execute erasure operation, a command (write command) that causes the semiconductor memory device 1 to execute write operation, a command (read command) that causes the semiconductor memory device 1 to execute readout operation, and the like. The data DAT includes read data and write data.

The memory controller 2 receives a command from the host equipment 4. Further, the memory controller 2 controls the semiconductor memory device 1 on the basis of the received command. More specifically, the memory controller 2 writes data for which it is commanded to perform write operation, in the semiconductor memory device 1 on the basis of the write command received from the host equipment 4. Further, the memory controller 2 reads out data for which it is commanded to perform readout operation from the host equipment 4, from the semiconductor memory device 1 on the basis of the read command received from the host equipment 4. Then, the memory controller 2 transmits the read data to the host equipment 4.

Examples of the host equipment 4 using the memory system 3 described above can include, for example, a digital camera, a personal computer, a server within a data center, and the like.

1.1.2 Memory Controller

As illustrated in FIG. 1, the memory controller 2 includes a central processing unit (CPU) 20, an internal memory 21, a buffer memory 22, a NAND interface circuit (NAND I/F) 23, and a host interface circuit (host I/F) 24. The memory controller 2 is, for example, constituted as a system-on-a-chip (SoC).

The CPU 20 controls operation of the whole memory controller 2. The CPU 20 issues, for example, commands for instructing the semiconductor memory device 1 to execute various kinds of operation such as write operation, readout operation and erasure operation.

The internal memory 21 is, for example, a semiconductor memory such as a dynamic random access memory (DRAM). The internal memory 21 is, for example, used as a work area of the CPU 20. The internal memory 21 stores, for example, firmware for managing the semiconductor memory device 1, various kinds of management tables, and the like.

The buffer memory 22 temporarily stores the write data received from the host equipment 4, the read data received by the memory controller 2 from the semiconductor memory device 1, and the like.

The NAND interface circuit 23 is connected to the semiconductor memory device 1 via the NAND bus. The NAND interface circuit 23 controls communication with the semiconductor memory device 1. For example, the NAND interface circuit 23 transmits the command CMD, the address ADD and the write data to the semiconductor memory device 1 by an instruction of the CPU 20. Further, the NAND interface circuit 23 receives the read data from the semiconductor memory device 1.

The host interface circuit 24 is connected to the host equipment 4 via the host bus. The host interface circuit 24 controls communication between the memory controller 2 and the host equipment 4. The host interface circuit 24, for example, transfers a command and data received from the host equipment 4 respectively to the CPU 20 and the buffer memory 22.

1.1.3 Semiconductor Memory Device

A configuration example of the semiconductor memory device 1 according to the first embodiment will be described using FIG. 2. FIG. 2 is a block diagram illustrating one example of a configuration of the semiconductor memory device according to the first embodiment.

The semiconductor memory device 1 includes a memory cell array 10, an input/output circuit 11, a logic control circuit 12, an address register 13, a command register 14, a sequencer 15, a driver module 16, a row decoder module 17, and a sense amplifier module 18.

The memory cell array 10 includes a plurality of blocks BLK0 to BLK(m−1) (where m is an integer equal to or greater than 1). Note that in the following description, in a case where the plurality of blocks BLK0 to BLK(m−1) are not distinguished from each other, each of the plurality of blocks BLK0 to BLK(m−1) will be simply referred to as a block BLK. Each block BLK is a collection of a plurality of memory cell transistors capable of storing data in a non-volatile manner. Each block BLK is, for example, used as a data erasure unit. In other words, data to be stored in memory cell transistors included in the same block BLK is collectively erased. A detailed configuration of the memory cell array 10 will be described later.

The input/output circuit 11 transmits/receives the signal DQ<7:0> to/from the memory controller 2. The input/output circuit 11 transfers the address ADD and the command CMD within the signal DQ<7:0> respectively to the address register 13 and the command register 14. Further, the input/output circuit 11 transmits/receives the data DAT to/from the sense amplifier module 18.

The logic control circuit 12 receives, for example, the signals /CE, CLE, ALE, /WE, /RE, RE, /WP, DQS, and/DQS from the memory controller 2 and controls the input/output circuit 11 on the basis of the received signals. Further, the logic control circuit 12 generates the signal /RB and transmits the signal /RB to the memory controller 2.

The address register 13 stores the address ADD transferred from the input/output circuit 11. The address register 13 transfers the stored address ADD to the row decoder module 17 and the sense amplifier module 18.

The command register 14 stores the command CMD transferred from the input/output circuit 11. The command register 14 transfers the stored command CMD to the sequencer 15.

The sequencer 15 receives the command CMD from the command register 14. The sequencer 15 controls the whole semiconductor memory device 1 in accordance with a sequence based on the received command CMD. For example, in case where the sequencer 15 receives each of an erase command, a write command and a read command, the sequencer 15 instructs the driver module 16 to generate a voltage to be used in operation corresponding to the command.

The driver module 16 generates a voltage to be used in erasure operation, write operation, readout operation, or the like, on the basis of the instruction from the sequencer 15. The driver module 16 supplies the generated voltage to the row decoder module 17, the sense amplifier module 18, the memory cell array 10, or the like.

The row decoder module 17 receives a block address within the address ADD from the address register 13. The row decoder module 17 selects one of m blocks BLK on the basis of the received block address. The row decoder module 17, for example, applies the voltage supplied from the driver module 16 to the selected block BLK.

The sense amplifier module 18 receives a column address within the address ADD from the address register 13. The sense amplifier module 18 transfers the data DAT between the memory controller 2 and the memory cell array 10 on the basis of the received column address. More specifically, the sense amplifier module 18 receives write data from the input/output circuit 11 upon write operation. Then, the sense amplifier module 18 transfers the received write data to the memory cell array 10. Further, the sense amplifier module 18 senses a threshold voltage of the memory cell transistor to be subjected to readout operation within the memory cell array 10 and generates read data upon readout operation. Then, the sense amplifier module 18 transfers the generated read data to the input/output circuit 11.

1.1.4 Circuit Configuration of Memory Cell Array

A circuit configuration of the memory cell array 10 of the semiconductor memory device 1 according to the first embodiment will be described using FIG. 3. FIG. 3 is a circuit diagram for explaining one example of a configuration of the memory cell array of the semiconductor memory device according to the first embodiment.

Each block BLK includes, for example, five string units SU0 to SU4. Each of the string units SU0 to SU4 includes a plurality of NAND strings NS. Note that in the following description, in a case where the string units SU0 to SU4 are not distinguished from each other, each of the string units SU0 to SU4 will be simply referred to as a string unit SU. Further, the number of the string units SU included in each block BLK is not limited to five. The number of the string units SU included in each block BLK may be one to four or six or more.

Each NAND string NS includes, for example, eight memory cell transistors MT0 to MT7, and selection transistors ST1 and ST2. Each of the memory cell transistors MT0 to MT7 includes a gate and a charge accumulation layer. The memory cell transistors MT0 to MT7 are connected in series between the selection transistors ST1 and ST2. Note that in the following description, in a case where the memory cell transistors MT0 to MT7 are not distinguished from each other, each of the memory cell transistors MT0 to MT7 will be simply referred to as a memory cell transistor MT. Further, in a case where the selection transistors ST1 and ST2 are not distinguished from each other, each of the selection transistors ST1 and ST2 will be simply referred to as a selection transistor ST. Further, the number of the memory cell transistors MT included in each NAND string NS is not limited to eight. The number of the memory cell transistors MT included in each NAND string NS may be 16, 32, 48, 64, 96, 128, or the like, and the number is not limited. Further, each number of the selection transistors ST1 and ST2 is not limited to one and may be arbitrary number.

Gates of the selection transistors ST1 of the string units SU0 to SU4 within each block BLK are respectively connected to selection gate lines SGD0 to SGD4. A gate of the selection transistor ST2 of the string unit SU within each block BLK is connected to a selection gate line SGS. Note that while not illustrated, each block BLK may include, for example, five selection gate lines SGS0 to SGS4. In this case, gates of the selection transistors ST2 of the string units SU0 to SU4 may be respectively connected to selection gate lines SGS0 to SGS4 in a similar manner to the gates of the selection transistors ST1 of the string units SU0 to SU4. Note that in the following description, in a case where the selection gate lines SGD0 to SGD4 are not distinguished from each other, each of the selection gate lines SGD0 to SGD4 will be simply referred to as a selection gate line SGD.

Gates of the memory cell transistors MT0 to MT7 within each block BLK are respectively connected to word lines WL0 to WL7. Note that the number of the word lines WL included in each block BLK is not limited to eight in a similar manner to the number of the memory cell transistors MT included in each NAND string NS. The number of the word lines WL included in each block BLK may be 16, 32, 48, 64, 96, 128, or the like, and the number is not limited. Further, in the following description, in a case where the word lines WL0 to WL7 are not distinguished from each other, each of the word lines WL0 to WL7 will be simply referred to as a word line WL.

With the configuration as described above, the word lines WL and the selection gate lines SGS are connected to the string units SU0 to SU4 in each block BLK. On the other hand, each selection gate line SGD is connected to one string unit SU corresponding to the selection gate line SGD in each block BLK.

The other ends of the selection transistors ST1 of the NAND strings NS in the same row among the NAND strings NS arranged in a matrix within the memory cell array 10 are connected to one of n (n is an integer equal to or greater than 2) bit lines BL (BL0 to BL(n−1)). Further, the bit lines BL are connected to the NAND strings NS in the same row across a plurality of blocks BLK.

The other ends of the selection transistors ST2 are connected to a source line SL. The source line SL is, for example, shared among the plurality of blocks BLK.

A collection of a plurality of memory cell transistors MT connected to a common word line WL within each string unit SU is, for example, referred to as a cell unit CU. Storage capacity of the cell unit CU including the plurality of memory cell transistors MT each storing 1-bit data is, for example, defined as "one-page data". The cell unit CU can have storage capacity of two-page data or more in accordance with the number of bits of data stored in the memory cell transistor MT.

1.1.5 Structure of Memory Cell Array

A structure of the memory cell array 10 of the semiconductor memory device 1 according to the first embodiment will be described using FIG. 4. FIG. 4 is a cross-sectional view for explaining one example of the structure of the memory cell array of the semiconductor memory device according to the first embodiment. Note that in the following drawings, an X direction corresponds to an extending direction of the word line WL. Further, a Y direction orthogonal to the X direction in a horizontal plane corresponds to an extending direction of the bit line BL. A Z direction orthogonal to the horizontal plane corresponds to a vertical direction with respect to a surface of a semiconductor substrate to be used to form the semiconductor memory device 1.

The memory cell array 10 further includes a semiconductor substrate 40, conductive layers 41 to 45, and insulating layers 30 to 34.

The insulating layer 30 is provided on the semiconductor substrate 40. While not illustrated in FIG. 4, the insulating layer 30 and the semiconductor substrate 40 include, for example, circuits such as the row decoder module 17 and the sense amplifier module 18. Note that in the following description, a side on which the memory cell array 10 is provided with respect to the semiconductor substrate 40 is set as an upper side.

The conductive layer 41 is provided on the insulating layer 30. The conductive layer 41 is formed, for example, in a plate shape expanding along an XY plane. The conductive layer 41 is used as the source line SL. The conductive layer 41 includes, for example, silicon doped with phosphorus.

The insulating layer 31 is provided on the conductive layer 41. The conductive layer 42 is provided on the insulating layer 31. The conductive layer 42 is formed, for example, in a plate shape expanding along the XY plane. The conductive layer 42 is used as the selection gate line SGS. The conductive layer 42 includes, for example, tungsten.

Eight insulating layers 32 and eight conductive layers 43 are laminated on the conductive layer 42. The eight insulating layers 32 and the eight conductive layers 43 are sequentially laminated in order of the insulating layer 32, the conductive layer 43, the insulating layer 32, . . . , the conductive layer 43, the insulating layer 32, and the conductive layer 43 from the bottom. The conductive layer 43 is formed, for example, in a plate shape expanding along the XY plane. The plurality of laminated conductive layers 43 are respectively used as the word lines WL0 to WL7 sequentially from the side of the semiconductor substrate 40. The conductive layer 43 includes, for example, tungsten.

The insulating layer 33 is provided on the uppermost conductive layer 43. The conductive layer 44 is provided on the insulating layer 33. The conductive layer 44 is formed, for example, in a plate shape expanding along the XY plane. The conductive layer 44 is used as the selection gate line SGD. The conductive layer 44 includes, for example, tungsten.

Note that in the following description, each of the conductive layers 42 to 44 will be also simply referred to as a laminated wiring.

The insulating layer 34 is provided on the conductive layer 44. A plurality of conductive layers 45 are provided on the insulating layer 34. Each conductive layer 45 is formed, for example, in a line shape extending in the Y direction. Note that FIG. 4 illustrates only one conductive layer 45 among the plurality of conductive layers 45. Each conductive layer 45 is used as the bit line BL. The conductive layer 45 includes, for example, copper.

Each of the memory pillars MP is provided extending along the Z direction and penetrates through the insulating layers 31 to 33 and the conductive layers 42 to 44. A bottom portion of the memory pillar MP is in contact with the conductive layer 41. A portion at which the memory pillar MP intersects the conductive layer 42 functions as the selection transistor ST2. A portion at which the memory pillar MP intersects one conductive layer 43 functions as one memory cell transistor MT. A portion at which the memory pillar MP intersects the conductive layer 44 functions as the selection transistor ST1.

Further, each of the memory pillars MP includes, for example, a core member 50, a semiconductor layer 51, and a laminated film 52. The core member 50 is provided extending along the Z direction. An upper end of the core member 50 is, for example, located above the conductive layer 44. A lower end of the core member 50 is, for example, located in a layer lower than the conductive layer 42. The semiconductor layer 51 covers a circumference of the core member 50. Part of the semiconductor layer 51 is in contact with the conductive layer 41 in a lower portion of the memory pillar MP. The laminated film 52 covers a side surface and a bottom surface of the semiconductor layer 51 except a portion at which the semiconductor layer 51 is in contact with the conductive layer 41. The core member 50 includes, for example, an insulator such as silicon oxide. The semiconductor layer 51 includes, for example, silicon.

A columnar contact CV is provided on an upper surface of the semiconductor layer 51 within the memory pillar MP. In the illustrated region, one contact CV corresponding to one memory pillar MP among three memory pillars MP is illustrated. The contact CV is connected, in a region not illustrated, to the memory pillar MP which does not overlap with a member SHE and to which the contact CV is not connected in a memory region MR.

One conductive layer 45 is electrically connected to an upper surface of the contact CV. The contact CV is provided so that one contact CV is connected to one conductive layer 45 in each of spaces separated by members SLT and SHE. In other words, one memory pillar MP included in each string unit SU is electrically connected to each of the conductive layers 45.

The member SLT, for example, has a portion provided along an XZ plane. The member SLT, for example, divides the conductive layers 42 to 44. The member SLT includes a contact LI and a spacer SP. The contact LI is, for example, a conductor having a portion provided extending in the X direction. The spacer SP is, for example, an insulator provided on a side surface of the contact LI. A portion between the contact LI and a laminated wiring adjacent to the contact LI in the Y direction is separated by the spacer SP.

By this means, the contact LI and the laminated wiring adjacent to the contact LI in the Y direction are electrically insulated from each other. Note that the contact LI may be an insulator. In this case, the contact LI and the spacer SP can be integrally formed.

The member SHE, for example, has a portion provided along the XZ plane. The member SHE, for example, divides the conductive layer 44. A lower surface of the member SHE is, for example, located between the uppermost conductive layer 43 and the conductive layer 44. The member SHE includes, for example, an insulator such as silicon oxide.

1.1.6 Structure of Memory Pillar

Figure 5:
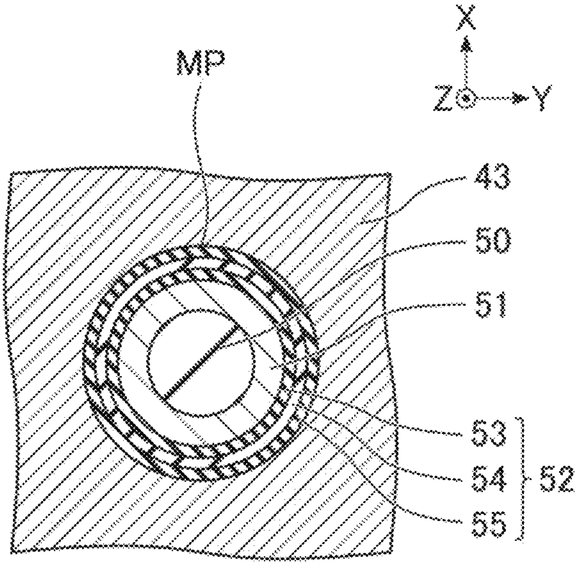
FIG. 5 is a cross-sectional view along a line V-V in FIG. 4, illustrating one example of a cross-sectional structure of a memory pillar included in the memory cell array of the semiconductor memory device according to the first embodiment.

A structure of the memory pillar MP in the semiconductor memory device 1 according to the first embodiment will be described using FIG. 5. FIG. 5 is a cross-sectional view along a line V-V in FIG. 4, illustrating one example of a cross-sectional structure of the memory pillar included in the memory cell array of the semiconductor memory device according to the first embodiment.

The laminated film 52 includes, for example, a tunnel insulating film 53, an insulating film 54, and a block insulating film 55.

In a cross-section including the conductive layer 43, the core member 50 is provided at a central portion of the memory pillar MP. The core member 50 has, for example, a circular shape in the XY plane. The semiconductor layer 51 encloses a side surface of the core member 50. The tunnel insulating film 53 encloses a side surface of the semiconductor layer 51. The insulating film 54 encloses a side surface of the tunnel insulating film 53. The block insulating film 55 encloses a side surface of the insulating film 54. The conductive layer 43 encloses a side surface of the block insulating film 55. Each of the tunnel insulating film 53 and the block insulating film 55 includes, for example, silicon oxide. The insulating film 54 includes, for example, silicon nitride.

With the configuration as described above, the memory pillar MP has, for example, a circular shape in the XY plane.

The semiconductor layer 51 functions as channels of the memory cell transistors MT0 to MT7, and the selection transistors ST1 and ST2. In other words, the semiconductor layer 51 functions as a channel of the memory pillar MP and a channel of the NAND string NS. Further, the insulating film 54 is used as a charge accumulation layer of the memory cell transistor MT. The semiconductor memory device 1 applies a current to the memory pillar MP between the bit line BL and the source line SL by putting the memory cell transistors MT0 to MT7 and the selection transistors ST1 and ST2 into an ON state.

1.1.7 Threshold Voltage Distribution of Memory Cell Transistor

Threshold voltage distribution of the memory cell transistors MT in the semiconductor memory device 1 according to the first embodiment will be described using FIG. 6. FIG. 6 is a schematic view indicating one example of the threshold voltage distribution of the memory cell transistors included in the memory cell array of the semiconductor memory device according to the first embodiment. In the threshold voltage distribution indicated in FIG. 6, a horizontal axis corresponds to a threshold voltage of the memory cell transistors MT. A vertical axis corresponds to the number of the memory cell transistors MT. In FIG. 6, the threshold voltage and the number of the memory cell transistors MT are respectively indicated as a voltage Vth and a value NMTs.

In the semiconductor memory device 1 according to the first embodiment, for example, eight states are formed by the threshold voltages of the plurality of memory cell transistors MT in each block BLK. In the following description, the eight states will be referred to as an "Er" state, an "A" state, a "B" state, a "C" state, a "D" state, an "E" state, an "F" state, and a "G" state in ascending order of the threshold voltage. The number of the memory cell transistors MT included in the "Er" state to the "G" state is, for example, set substantially equal to each other.

The "Er" state corresponds to, for example, a data erasure state. The threshold voltage of the memory cell transistors MT included in the "Er" state is less than a voltage VRA.

The "A" state, the "B" state, the "C" state, the "D" state, the "E" state, the "F" state, and the "G" state correspond to a state where data is written. The threshold voltage of the memory cell transistors MT included in the "A" state is equal to or higher than the voltage VRA and less than a voltage VRB (VRB>VRA). The threshold voltage of the memory cell transistors MT included in the "B" state is equal to or higher than the voltage VRB and less than a voltage VRC (VRC>VRB). The threshold voltage of the memory cell transistors MT included in the "C" state is equal to or higher than the voltage VRC and less than a voltage VRD (VRD>VRC). The threshold voltage of the memory cell transistors MT included in the "D" state is equal to or higher than the voltage VRD and less than a voltage VRE (VRE>VRD). The threshold voltage of the memory cell transistors MT included in the "E" state is equal to or higher than the voltage VRE and less than a voltage VRF (VRF>VRE). The threshold voltage of the memory cell transistors MT included in the "F" state is equal to or higher than the voltage VRF and less than a voltage VRG (VRG>VRF). The threshold voltage of the memory cell transistors MT included in the "G state" is equal to or higher than the voltage VRG and less than a voltage VREAD (VREAD>VRG). The voltage VREAD is a voltage that puts the memory cell transistor MT into an ON state regardless of whether the memory cell transistor MT is in one of the "Er" state to the "G" state in a case where the voltage is supplied to the gate (word line WL) of the memory cell transistor MT.

The memory cell transistor MT is put into an ON state in a case where the voltage supplied to the gate (word line WL) is higher than the threshold voltage of the memory cell transistor MT. Further, the memory cell transistor MT is put into an OFF state in a case where the voltage supplied to the gate (word line WL) is equal to or lower than the threshold voltage of the memory cell transistor MT.

3-bit data different from each other is allocated to the eight types of threshold voltage distribution of the memory cell transistors MT described above. One example of allocation of data to the threshold voltage distribution will be listed below. In the following description, data allocated to each state is indicated in order of "a higher-order bit, a middle-order bit and a lower-order bit" in accordance with the state.

"Er" state: "1, 1, 1" data
"A" state: "1, 1, 0" data
"B" state: "1, 0, 0" data
"C" state: "0, 0, 0" data
"D" state: "0, 1, 0" data
"E" state: "0, 1, 1" data
"F" state: "0, 0, 1" data
"G" state: "1, 0, 1" data In a case where such allocation of data is applied, one-page data (lower-order page data) constituted with lower-order bits is determined by readout operation using each of the voltages VRA and VRE. One-page data (middle-order page data) constituted with middle-order bits is determined by readout operation using each of the voltages VRB, VRD, and VRF. One-page data (higher-order page data) constituted with high-order bits is determined by readout operation using each of the voltages VRC and VRG.

Further, a verify voltage to be used in determination of the threshold voltage of the memory cell transistors MT during write operation is set at each of between adjacent states. More specifically, a voltage VA is set between the "Er" state and the "A" state as the verify voltage. The voltage VA is, for example, higher than the voltage VRA. A voltage VB is set between the "A" state and the "B" state as the verify voltage. The voltage VB is, for example, higher than the voltage VRB. A voltage VC is set between the "B" state and the "C" state as the verify voltage. The voltage VC is, for example, higher than the voltage VRC. A voltage VD is set between the "C" state and the "D" state as the verify voltage. The voltage VD is, for example, higher than the voltage VRD. A voltage VE is set between the "D" state and the "E" state as the verify voltage. The voltage VE is, for example, higher than the voltage VRE. A voltage VF is set between the "E" state and the "F" state as the verify voltage. The voltage VF is, for example, higher than the voltage VRF. A voltage VG is set between the "F" state and the "G" state as the verify voltage. The voltage VG is, for example, higher than the voltage VRG.

Note that while in the description of the semiconductor memory device 1 according to the first embodiment, a case has been described where each memory cell transistor MT stores 3-bit data, the present invention is not limited to this. The semiconductor memory device 1 may be configured so that each memory transistor MT stores, for example, 2-bit data or 4 or more-bit data.

1.1.8 Sense Amplifier Module

Figure 7:
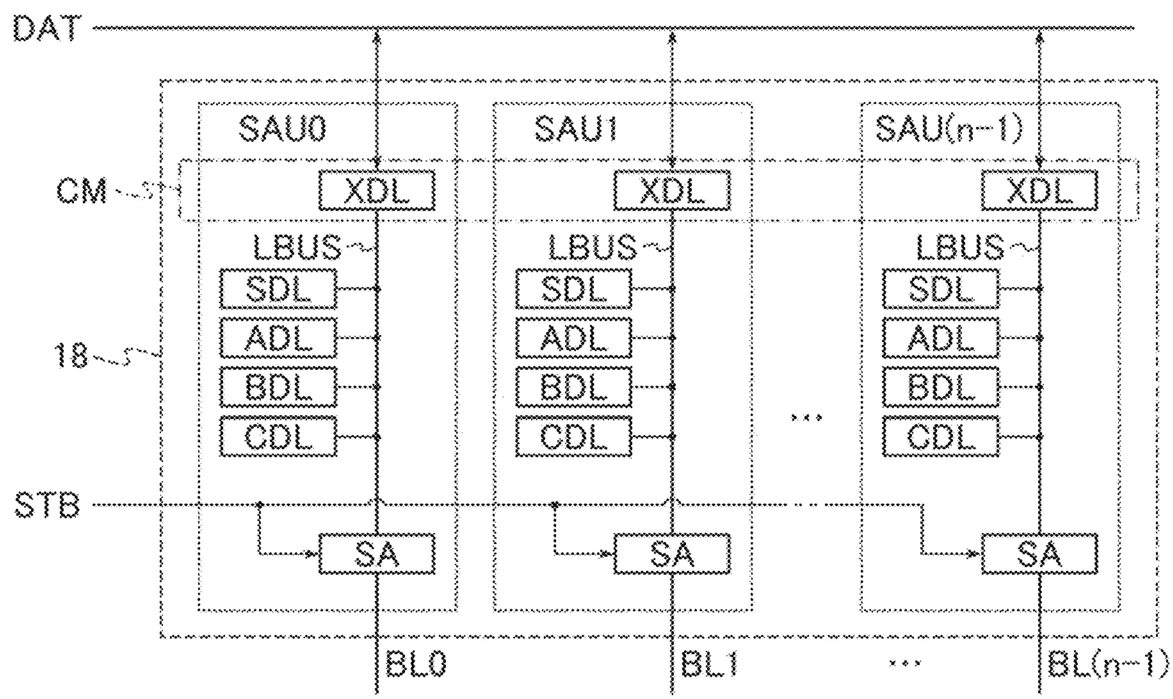
FIG. 7 is a block diagram illustrating one example of a configuration of a sense amplifier module of the semiconductor memory device according to the first embodiment.

A configuration of the sense amplifier module 18 in the semiconductor memory device 1 according to the first embodiment will be described next using FIG. 7. FIG. 7 is a block diagram illustrating one example of the configuration of the sense amplifier module of the semiconductor memory device according to the first embodiment.

The sense amplifier module 18 includes sense amplifier units SAU0 to SAU(n−1). The sense amplifier units SAU0 to SAU(n−1) are respectively associated with bit lines BL0 to BL(n−1). In the following description, in a case where the sense amplifier units SAU0 to SAU(n−1) are not distinguished from each other, each of the sense amplifier units SAU0 to SAU(n−1) will be simply referred to as a sense amplifier unit SAU.

Each sense amplifier unit SAU includes, for example, a sense amplifier portion SA, and latch circuits SDL, ADL, BDL, CDL, and XDL.

In each sense amplifier unit SAU, the sense amplifier portion SA and the latch circuits SDL, ADL, BDL, CDL, and XDL are connected to a bus LBUS. The latch circuits SDL, ADL, BDL, CDL, and XDL can transmit/receive data to/from each other.

The sense amplifier portion SA directly controls the bit line BL. The sense amplifier portion SA applies a voltage to the bit line BL in accordance with the write data upon write operation. Further, the sense amplifier portion SA reads out data by sensing a threshold voltage of the memory cell transistor MT by a voltage or a current of the bit line BL corresponding to the sense amplifier unit SAU upon readout operation. Upon readout operation, for example, a signal STB is provided to the sense amplifier portion SA by the sequencer 15. The sense amplifier portion SA determines read data at a timing at which the signal STB is asserted and causes the latch circuit SDL to store the read data.

Each of the latch circuits SDL, ADL, BDL, CDL, and XDL temporarily stores data. The latch circuit XDL is used to input/output the data DAT between the input/output circuit and the sense amplifier unit SAU of the semiconductor memory device 1. Further, the latch circuit XDL can be also used as, for example, a cache memory CM of the semiconductor memory device 1.

1.2 Operation

Operation using the semiconductor memory device 1 according to the first embodiment will be described next.

Note that in the following description, a word line WL selected on the basis of the address ADD will be referred to as a selection word line WL. Further, a word line WL that is not selected will be referred to as a non-selection word line WL. Still further, a memory cell transistor MT connected to the selection word line WL will be referred to as a selection memory cell transistor MT.

1.2.1 Outline of Write Operation

Figure 8:
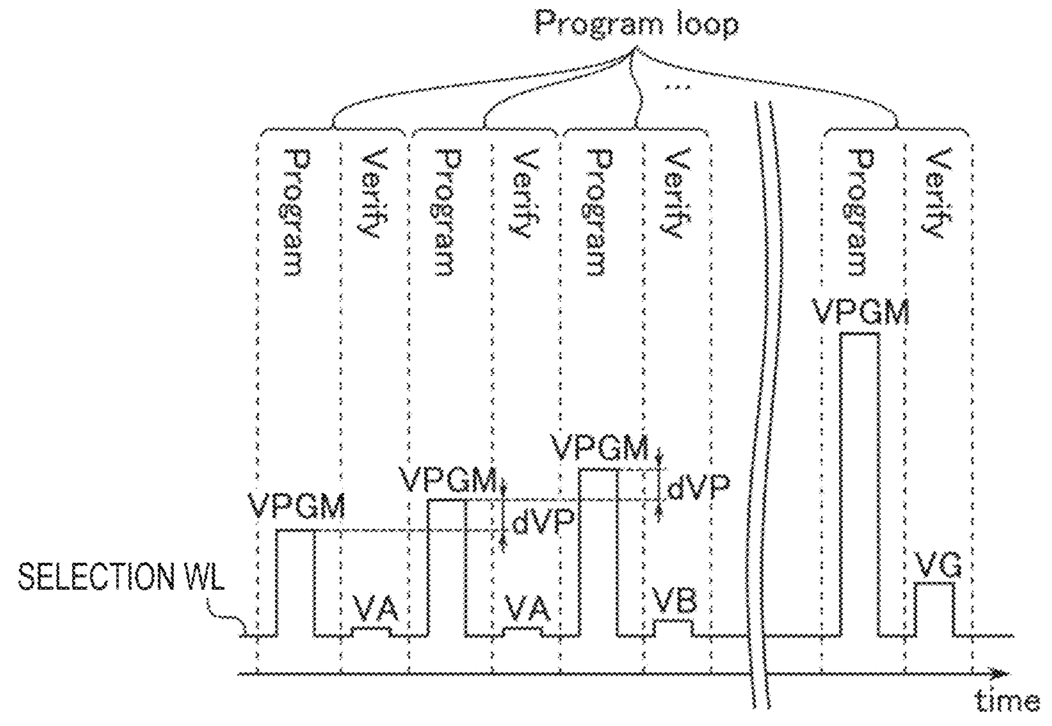
FIG. 8 is a timing chart indicating outline of write operation of the semiconductor memory device according to the first embodiment.

Outline of write operation of the semiconductor memory device 1 according to the first embodiment will be described using FIG. 8. FIG. 8 is a timing chart indicating outline of the write operation of the semiconductor memory device according to the first embodiment.

The semiconductor memory device 1 repeatedly executes program loop operation (program loop) in the write operation. FIG. 8 indicates change of a voltage of the selection word line WL in association with increase in the number of times the program loop operation is executed in the write operation. In the drawing described below, the selection word line WL is indicated as a selection WL. Note that in the following description, the number of times the program loop operation is executed will be simply referred to as the number of loops.

Each time of the program loop operation includes program operation (program) and verify operation (verify). The semiconductor memory device 1 increases the threshold voltage of the memory cell transistor MT to a target voltage (hereinafter, also referred to as a "target level") by repeating the program loop operation.

In each time of the program loop operation, the sequencer 15 executes the program operation before the verify operation.

The program operation is operation that can increase the threshold voltage of the memory cell transistor MT. In the program operation, a plurality of selection memory cell transistors MT are set as memory cell transistors MT to be subjected to program or memory cell transistors MT for which program is prohibited on the basis of the write data stored in the associated sense amplifier unit SAU. In a case where the threshold voltage of the selection memory cell transistor MT does not reach the target threshold voltage, the selection memory cell transistor MT is set as the memory cell transistor MT to be subjected to program. On the other hand, in a case where the threshold voltage of the selection memory cell transistor MT reaches the target threshold voltage, the selection memory cell transistor MT is set as the memory cell transistor MT for which program is prohibited.

In the program operation, a voltage VPGM (write voltage) is supplied to the selection word line WL. The voltage VPGM is a voltage that can increase the threshold voltage of the selection memory cell transistor MT. The voltage VPGM, for example, becomes higher in accordance with increase in the number of loops. In the example in FIG. 8, as the number of loops increases, the voltage VPGM increases by a voltage dVP. If the voltage VPGM is supplied to the selection word line WL, the threshold voltage of the memory cell transistor MT to be subjected to program increases. On the other hand, the threshold voltage of the selection memory cell transistor MT set as the memory cell transistor MT for which program is prohibited is maintained.

In the following description, operation that increases the threshold voltage of the memory cell transistor MT will be referred to as ""0" program operation". Further, operation that maintains the threshold voltage of the memory cell transistor MT will be referred to as ""1" program operation".

If the program operation ends, the sequencer 15 executes the verify operation.

The verify operation is readout operation that confirms whether the threshold voltage of the selection memory cell transistor MT reaches the target threshold voltage. The sequencer 15, for example, executes the readout operation using a predetermined verify voltage on the memory cell transistor MT to be subjected to program in each time of the program loop operation.

Note that while in the example in FIG. 8, an example is indicated where one verify voltage is used in each time of the verify operation, the present invention is not limited to this. A plurality of verify voltages may be used in each time of the verify operation. In this case, the sequencer 15, for example, sequentially executes the readout operation using the plurality of verify voltages.

In the verify operation, the sense amplifier unit SAU determines whether the threshold voltage of the selection memory cell transistor MT is higher than the verify voltage supplied to the selection word line WL on the basis of the voltage of the bit line BL. Each sense amplifier unit SAU determines the selection memory cell transistor MT for which the threshold voltage of the selection memory cell transistor MT is higher than the verify voltage, as "verify pass". On the other hand, each sense amplifier unit SAU determines the selection memory cell transistor MT for which the threshold voltage of the selection memory cell transistor MT is equal to or less than the verify voltage as "verify fail". Each sense amplifier unit SAU causes the verify result described above to be stored in one of the latch circuits inside the sense amplifier unit SAU. If the verify operation is completed, the sequencer 15 sets the respective selection memory cell transistors MT as the memory cell transistors MT to be subjected to program or the memory cell transistors MT for which program is prohibited on the basis of the result of the verify operation and starts the next program loop operation.

1.2.2 Program Operation

Figure 9:
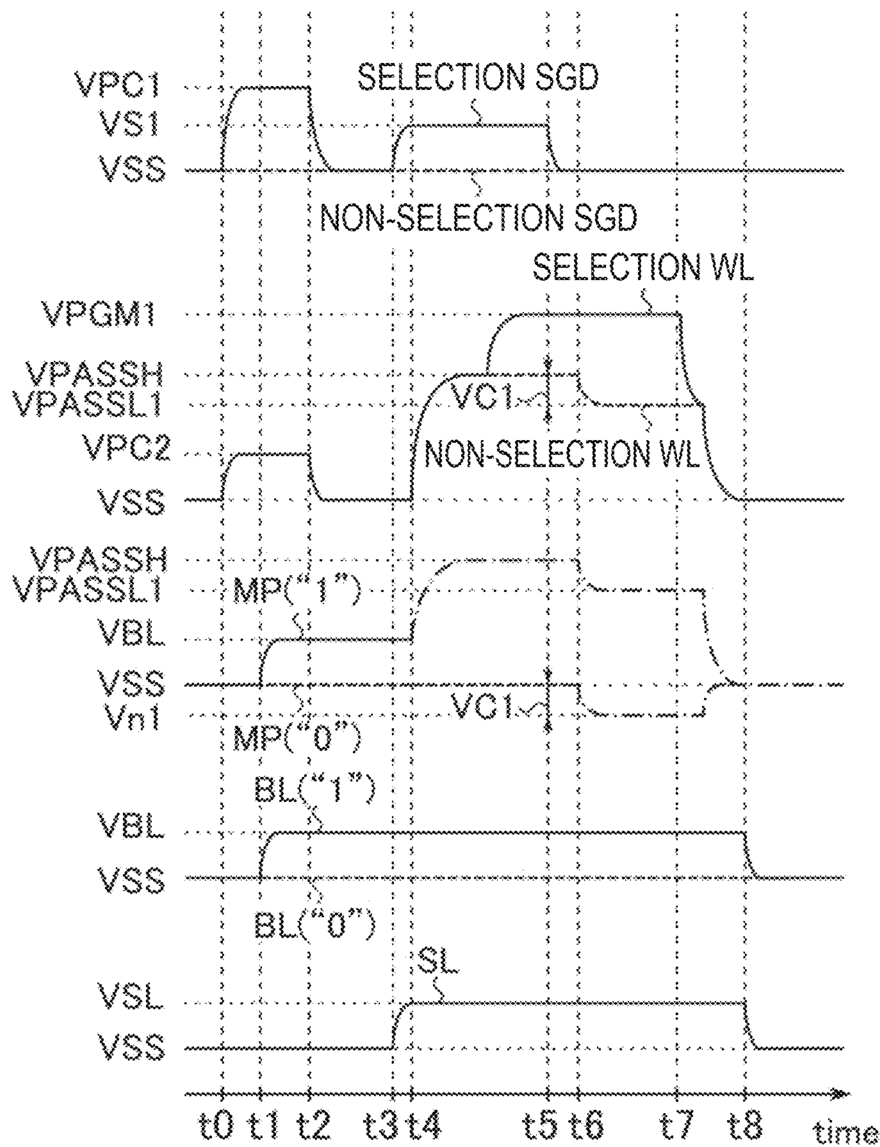
FIG. 9 is a timing chart indicating one example of voltages of a source line, a bit line, a channel of the memory pillar, a word line, and a selection gate line during program operation in the write operation using the semiconductor memory device according to the first embodiment.

Program operation in the write operation using the semiconductor memory device 1 according to the first embodiment will be described using FIG. 9. FIG. 9 is a timing chart indicating one example of voltages of a source line, a bit line, a channel of a memory pillar, a word line and a selection gate line during program operation in the write operation using the semiconductor memory device according to the first embodiment. Note that in the following timing chart, a voltage of the bit line BL is a voltage to be applied to the bit line BL by the sense amplifier portion SA.

At time t0, the row decoder module 17 selects one block BLK (selection block BLK) from a plurality of blocks BLK. Further, the row decoder module 17 selects one string unit SU (selection string unit SU) among a plurality of string units SU. Then, the row decoder module 17 applies a voltage VPC1 (>VSS) to the selection gate line SGD (selection SGD in FIG. 9) in the selection string unit SU. The voltage VSS is a ground voltage. This puts the selection transistor ST1 corresponding to the selection string unit SU into an ON state. A voltage VSS is applied to the selection gate line SGD (non-selection SGD in FIG. 9) of the string unit SU (non-selection string unit SU) other than the selection string unit SU among the plurality of string units SU. This puts the selection transistor ST1 corresponding to the non-selection string unit SU into an OFF state. Further, the voltage VSS is applied to the selection gate line SGS. This puts the selection transistor ST2 into an OFF state. Further, the row decoder module 17 applies a voltage VPC2 (>VSS) to all the word lines WL of the selection block BLK. This puts all the memory cell transistors MT of the selection block BLK into an ON state.

In other words, at time t0, the row decoder module 17 supplies a voltage for electrically connecting channels of all the memory pillars MP respectively to the corresponding bit lines BL, to the selection block BLK. In this case, the voltage VPC2 may be applied only to the word lines WL (selection word lines WL) to be subjected to program operation and the word lines WL (non-selection word lines WL) located on a side of the bit line BL among the word lines WL of the selection block BLK. Note that at time t0, the row decoder module 17 may supply a voltage for electrically connecting channels of all the memory pillars MP to the source line SL, to the selection block BLK. In this case, as well as the voltage VPC1 being applied to the selection gate line SGS, the voltage VPC2 may be applied only to the word lines WL (selection word lines WL) to be subjected to program operation and word lines WL (non-selection word lines WL) located on a side of the source line SL among the word lines WL of the selection block BLK.

At time t1, the sense amplifier module 18 applies a voltage VBL to the bit line BL (hereinafter, the bit line BL ("1")) corresponding to the memory cell transistor MT to be subjected to "1" program operation. This makes a voltage of the channel of the memory pillar MP (hereinafter, the memory pillar MP ("1")) corresponding to the memory cell transistor MT to be subjected to "1" program operation equal to the voltage VBL. On the other hand, the voltage VSS is applied to the bit line BL (hereinafter, the bit line BL ("0")) corresponding to the memory cell transistor MT to be subjected to "0" program operation. This makes a voltage of the channel of the memory pillar MP (hereinafter, the memory pillar MP ("0")) corresponding to the memory cell transistor MT to be subjected to "0" program operation equal to the voltage VSS. Note that FIG. 9 indicates the voltage of the channel of the memory pillar MP ("1") and the voltage of the channel of the memory pillar MP ("0") respectively simply as the memory pillar MP ("1") and the memory pillar MP ("0").

At time t2, the row decoder module 17 decreases a voltage of the selection gate line SGD in the selection string unit SU from the voltage VPC1 to the voltage VSS. Further, the row decoder module 17 decreases voltages of all the word lines WL of the selection block BLK from the voltage VPC2 to the voltage VSS.

At time t3, the row decoder module 17 applies a voltage VS1 (>VSS) to the selection gate line SGD in the selection string unit SU. The voltage VS1 is a voltage that puts the selection transistor ST1 in which the voltage VSS is applied to the bit line BL, into an ON state and puts the selection transistor ST1 in which the voltage VBL is applied to the bit line BL, into an OFF state. The voltage VS1 is, for example, equal to or lower than the voltage VPC1. Further, the driver module 16 applies a voltage VSL (>VSS) to the source line SL. By the above operation, the channel of the memory pillar MP ("1") is put into a floating state in which the channel is electrically insulated from the bit line BL and the source line SL. Note that the view indicating the following timing chart indicates a voltage in the floating state with a dash-dotted line.

At time t4, the row decoder module 17 selects one word line WL (selection word line WL) in the selection block BLK. The row decoder module 17 applies a voltage VPGM1 to the selection word line WL. Further, the row decoder module 17 applies a voltage VPASSH to other word lines WL (non-selection word lines WL) other than the selection word line WL among the word lines WL in the selection block BLK. In the drawing described below, the non-selection word lines WL are indicated as non-selection WL. Note that FIG. 9 indicates an example where the row decoder module 17 increases the voltage of the selection word line WL to the voltage VPGM1 after increasing the voltages of the selection word line WL and the non-selection word lines WL to the voltage VPASSH.

Further, through capacitive coupling between the channel of the memory pillar MP ("1") that is in the floating state, and the word line WL, the voltage of the channel increases to the voltage equal to the voltage VPASSH in a similar manner to the non-selection word lines WL.

At time t5, the row decoder module 17 decreases the voltage of the selection gate line SGD in the selection string unit SU from the voltage VS1 to the voltage VSS. This also puts the channel of the memory pillar MP ("0") into a floating state in which the channel is electrically insulated from the bit line BL and the source line SL.

At time t6, the row decoder module 17 decreases the voltages of other non-selection word lines WL from the voltage VPASSH to a voltage VPASSL1. The voltage VPASSL1 is a voltage lower than the voltage VPASSH by a voltage VC1.

This decreases the voltage of the channel of the memory pillar MP ("0") that is in the floating state to a voltage substantially equal to a voltage Vn1 (<VSS) through capacitive coupling between the channel and the word line WL. The voltage Vn1 is a voltage lower than the voltage VSS by the voltage VC1. The voltage Vn1 is, for example, a negative voltage. Further, the voltage of the channel of the memory pillar MP ("1") that is in the floating state decreases to the voltage substantially equal to the voltage VPASSL1 in a similar manner to the non-selection word lines WL through capacitive coupling between the channel and the word line WL.

In other words, in the NAND string NS corresponding to the bit line BL ("0"), a potential difference between the selection word line WL and the channel increases from "VPGM1-VSS" to "VPGM1-Vn1", electrons are injected to the charge accumulation layer of the memory cell transistor MT, and the threshold voltage thereof increases.

While a potential difference between the selection word line WL and the channel increases from "VPGM1-VPASSH" to "VPGM1-VPASSL1" also in the NAND string NS corresponding to the bit line BL ("1"), "VPGM1-VPASSL1" is sufficiently small, and thus, electrons are not injected to the charge accumulation layer of the memory cell transistor MT, and the threshold voltage thereof is maintained.

At time t7, the row decoder module 17 applies the voltage VSS to the selection word line WL and the non-selection word lines WL. By this means, injection of charges to the charge accumulation layer ends.

At time t8, the sense amplifier module 18 applies the voltage VSS to the bit line BL.

Further, the driver module 16 applies the voltage VSS to the source line SL.

As described above, the program operation ends.

Note that FIG. 9 is merely one example of the timing chart of the program operation according to the first embodiment, and timings at which the respective voltages are applied to the source line SL, the bit line BL, the channel of the memory pillar MP, the word line WL, and the selection gate lines SGD and SGS are not necessarily the same as the timings indicated in FIG. 9. For example, while FIG. 9 indicates an example where the voltage of the selection word line WL reaches the voltage VPGM1 before time t6 at which the voltages of the non-selection word lines WL are decreased from the voltage VPASSH to the voltage VPASSL1, the present invention is not limited to this. The row decoder module 17 may, for example, apply a voltage so that the voltage of the selection word line WL reaches the voltage VPGM1 after time t6 at which the voltages of the non-selection word lines WL are decreased from the voltage VPASSH to the voltage VPASSL1.

Further, a magnitude relationship of the voltages to be applied to the source line SL, the bit line BL, the channel of the memory pillar MP, the word line WL and the selection gate lines SGD and SGS is not necessary the same as a magnitude relationship of the voltages indicated in FIG. 9. For example, the voltage VPC1 to be applied to the selection gate line SGD in the selection string unit SU at time t0 only requires to be a voltage that puts the selection transistor ST1 into an ON state and can be set as appropriate in accordance with the threshold voltage of the selection transistor ST1. Voltages to be applied to the selection gate line SGD, the word line WL and the selection gate line SGS other than the above can be also set as appropriate in accordance with the threshold voltages of the selection transistor ST1, the memory cell transistor MT, and the selection transistor ST2.

1.3 Effects

According to the first embodiment, it is possible to prevent increase in a write voltage. Effects of the first embodiment will be described below.

In the semiconductor memory device 1 according to the first embodiment, the sequencer 15 is configured to put the channel of the NAND string NS corresponding to the bit line BL ("0") into a floating state while applying the voltage VPGM1 to the selection word line WL in the program operation of the write operation. In other words, the semiconductor memory device 1 according to the first embodiment makes a state of the channel of the NAND string NS corresponding to the bit line BL ("0") transition from a state where the channel is electrically connected to at least the bit line BL ("0") to a floating state in which the channel is electrically insulated from the bit line BL ("0") and the source line SL when the voltage VPGM1 is applied to the selection word line WL to inject electrons to the charge accumulation layer of the memory cell transistor MT (for example, during a period from time t4 to time t7 in FIG. 9). Further, in this event, the row decoder module 17 decreases the voltage of the non-selection word line WL from the voltage VPASSH to the voltage VPASSL1. By this means, the voltage of the channel of the NAND string NS that is put into the floating state, decreases through capacitive coupling between the channel and the word line WL. Thus, according to the semiconductor memory device 1 according to the first embodiment, a potential difference between the selection word line and the channel can be increased by decreasing the voltage of the channel via the non-selection word lines. In other words, by decreasing the voltages of the non-selection word lines by putting the channel of the NAND string NS corresponding to the bit line BL ("0") into a floating state, the voltage of the selection word line can be effectively increased. It is possible to secure a potential difference between the selection word line and the channel for injecting electrons to the charge accumulation layer in the program operation while preventing increase in a write voltage.

Further, according to the semiconductor memory device 1 according to the first embodiment, by preventing increase in a write voltage as described above, it is possible to prevent increase in a size of the semiconductor memory device 1 and increase in manufacturing cost. To supplement this, for example, by making the conductive layer and the insulating layer within the memory cell array thinner in the Z direction, it is possible to prevent increase in sizes of the memory cell array and the semiconductor memory device. However, it is known that in this case, a potential difference between the selection word line and the channel necessary for injecting electrons to the charge accumulation layer increases. By this means, in a case where the size of the memory cell array is made smaller, there is a case where a size of a circuit such as a driver module increases in association with increase in a write voltage. According to the semiconductor memory device 1 according to the first embodiment, it is possible to prevent increase in a write voltage as described above. By this means, even in a case where the size of the memory cell array 10 is made smaller, it is possible to prevent increase in a size of the circuit. Thus, according to the semiconductor memory device 1 according to the first embodiment, it is possible to prevent increase in a size of the semiconductor memory device 1 and increase in manufacturing cost.

Further, according to the semiconductor memory device 1 according to the first embodiment, the sense amplifier module 18 decreases the voltage of the channel through capacitive coupling between the channel and the word line WL instead of directly applying a voltage (negative voltage) less than the voltage VSS to the bit line BL. According to such a configuration, it is possible to prevent increase in a circuit configuration for the sense amplifier module to apply a voltage less than the voltage VSS to the bit line. Also through the above, it is possible to prevent increase in a size of the semiconductor memory device 1 and increase in manufacturing cost.

2. Modifications of First Embodiment

Various modifications can be made to the above-described first embodiment. Semiconductor memory devices according to modifications of the first embodiment will be described below.

2.1 First Modification of First Embodiment

While in the first embodiment described above, an example has been described where the "0" program operation and the "1" program operation are executed in the program operation, the present invention is not limited to this. For example, in the "0" program operation, one of a first program condition in which an increase amount of the threshold voltage is relatively large or a second program condition in which an increase amount of the threshold voltage is smaller than that in the first program condition may be applied in accordance with a difference between the target level and the threshold voltage of the memory cell transistors MT.

A configuration of the semiconductor memory device according to the first modification of the first embodiment can be substantially the same as the configuration of the semiconductor memory device according to the first embodiment. Program operation in write operation using the semiconductor memory device according to the first modification of the first embodiment will be mainly described below.

2.1.1 Outline of Program Operation

Figure 10:
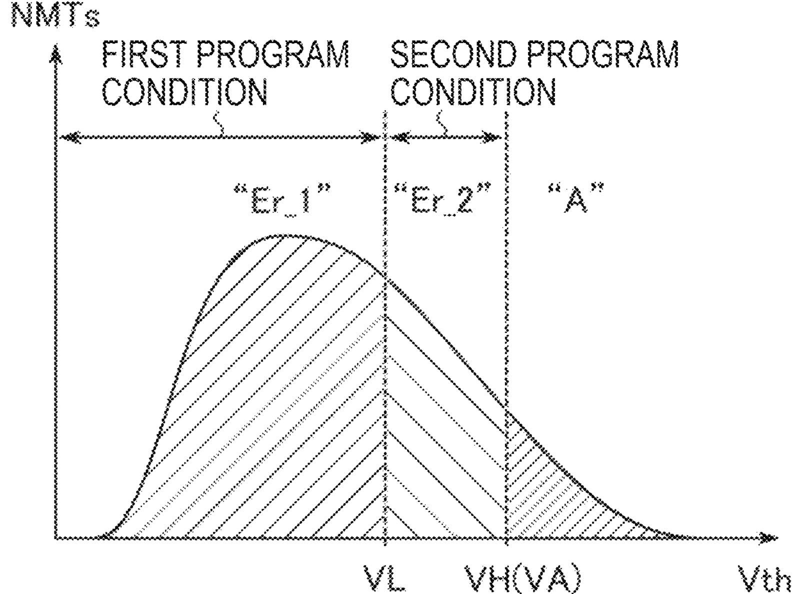
FIG. 10 is a view for explaining selection of program operation in write operation using a semiconductor memory device according to a first modification of the first embodiment.

The program operation in the write operation using the semiconductor memory device according to the first modification of the first embodiment will be described using FIG. 10. FIG. 10 is a view for explaining selection of the program operation in the write operation using the semiconductor memory device according to the first modification. Note that FIG. 10 indicates an example of threshold voltage distribution while writing is performed from the "Er" state toward the "A" state in the memory cell transistors MT for which the target level is the voltage VA.

For example, in a case where the threshold voltage of the memory cell transistors MT is sufficiently lower than the target level, and it is assumed that the threshold voltage does not reach the target level in the next program operation, the first program condition in which the increase amount of the threshold voltage is relatively large is applied. Further, in a case where the threshold voltage of the memory cell transistors MT is relatively close to the target level, and it is assumed that the threshold voltage largely exceeds the target level if the first program condition is applied in the next program operation, the second program condition is applied.

In a similar manner to the first embodiment, in a case where the threshold voltage of the memory cell transistors MT is equal to or higher than a voltage VH (target level), the "1" program operation is applied to the memory cell transistors MT. Further, in a case where the threshold voltage of the memory cell transistors MT is less than the voltage VH, the “0” program operation is applied to the memory cell transistors MT. The voltage VH in the example in FIG. 10 is the voltage VA.

In the “0” program operation, to judge which of the first program condition and the second program condition should be applied, for example, a predetermined voltage VL lower than the voltage VH can be set. In other words, in a case where the threshold voltage of the memory cell transistors MT is less than the voltage VL, the first program condition is applied to the memory cell transistors MT. The “0” program operation to which the first program condition is applied corresponds to the “0” program operation in the first embodiment. In a case where the threshold voltage of the memory cell transistors MT is equal to or higher than the voltage VL and less than the voltage VH, the second program condition is applied to the memory cell transistors MT in the next program operation. Note that in the example in FIG. 10, a state where the threshold voltage of the memory cell transistors MT is less than the voltage VL and a state where the threshold voltage of the memory cell transistors MT is equal to or higher than the voltage VL and less than the voltage VH are respectively an “Er 1” state and an “Er 2” state.

2.1.2 Timing Chart

A timing chart during program operation using the semiconductor memory device 1 according to the first modification of the first embodiment will be described next using FIG. 11. FIG. 11 is a timing chart indicating one example of voltages of a source line, a bit line, a channel of a memory pillar, a word line, and a selection gate line during program operation in write operation using the semiconductor memory device according to the first modification of the first embodiment.

Note that in the first modification of the first embodiment, the bit line BL corresponding to the memory cell transistor MT to be subjected to the “0” program operation, to which the first program condition is applied, and the bit line BL corresponding to the memory cell transistor to be subjected to the “1” program operation will be respectively referred to as a bit line BL (“0”) and a bit line BL (“1”). Further, the bit line BL corresponding to the memory cell transistor MT to be subjected to the “0” program operation, to which the second program condition is applied will be referred to as a bit line BL (“QPW”) in distinction from the bit line BL (“0”).

Operation of the semiconductor memory device 1 at time t10 to t13, t15, t17 and t18 can be made substantially the same as the operation of the semiconductor memory device at time t0 to t3, t5, t7, and t8 in the first embodiment except that a voltage equal to the voltage applied to the bit line BL (“0”) in the first embodiment is applied to the bit lines BL (“0”) and BL (“QPW”).

At time t14, the sense amplifier module 18 applies a voltage VBLQ (>VSS) to the bit line BL (“QPW”). The voltage VBLQ is a voltage lower than the voltage VBL. In a case where the voltage VS1 is applied to the selection gate line SGD, the selection transistor ST1 in which the voltage VBLQ is applied to the bit line BL is put into an ON state. By this means, a voltage of the channel of the memory pillar MP (“QPW”) corresponding to the bit line BL (“QPW”) becomes equal to the voltage VBLQ of the bit line BL (“QPW”).

At time t15, in a similar manner to time t5 in the first embodiment, the voltage of the selection gate line SGD decreases from the voltage VS1 to the voltage VSS. By this means, the channel of the memory pillar MP (“0”) corresponding to the bit line BL (“0”) and the channel of the memory pillar MP (“QPW”) are put into a floating state in which the channels are electrically insulated from the bit line BL and the source line SL in a similar manner to the channel of the memory pillar MP (“0”) at time t5 in the first embodiment.

At time t16, a voltage of the channel of the memory pillar MP (“0”) and a voltage of the channel of the memory pillar MP (“1”) decrease through capacitive coupling between the channels and the word line WL respectively in a similar manner to the channel of the memory pillar MP (“0”) and the channel of the memory pillar MP (“1”) at time t6 in the first embodiment. Further, a voltage of the channel of the memory pillar MP (“QPW”) corresponding to the bit line BL (“QPW”) decreases to a voltage substantially equal to a voltage Vn2 through capacitive coupling between the channel and the word line WL. The voltage Vn2 is a voltage lower than the voltage VBLQ by the voltage VC1.

As described above, in the NAND string NS corresponding to the bit line BL (“0”), in a similar manner to the NAND string NS corresponding to the bit line BL (“0”) in the first embodiment, electrons are injected to the charge accumulation layer, and the threshold voltage of the memory cell transistors MT is increased.

Further, in the NAND string NS corresponding to the bit line BL (“QPW”), a potential difference (VPGM1-Vn2) between the selection word line and the channel is large, and thus, electrons are injected to the charge accumulation layer, and the threshold voltage of the memory cell transistors MT is increased. Note that the potential difference (VPGM1-Vn2) is smaller than the potential difference (VPGM1-Vn1), and thus, an increase amount of the threshold voltage of the memory cell transistors MT is smaller than the increase amount of the threshold voltage of the memory cell transistors MT of the NAND string NS corresponding to the bit line BL (“0”).

The program operation ends as described above.

Effects equivalent to the effects of the first embodiment are provided also by the first modification of the first embodiment.

2.2 Second Modification of First Embodiment

While an example has been described in the first embodiment described above where the row decoder module 17 decreases the voltage of the selection gate line SGD in the selection string unit SU to the voltage VSS at time t5 during program operation, the present invention is not limited to this. The row decoder module 17 may decrease the voltage of the selection gate line SGD to a voltage less than the voltage VSS.

A configuration of a semiconductor memory device according to a second modification of the first embodiment can be made substantially the same as the configurations of the semiconductor memory devices according to the first embodiment and the first modification of the first embodiment. Program operation in write operation using the semiconductor memory device according to the second modification of the first embodiment will be mainly described below.

A timing chart during the program operation using the semiconductor memory device 1 according to the second modification of the first embodiment will be described using FIG. 12. FIG. 12 is a timing chart indicating one example of voltages of a source line, a bit line, a channel of a memory pillar, a word line, and a selection gate line during the program operation in the write operation using the semiconductor memory device according to the second modification of the first embodiment.

Operation of the semiconductor memory device 1 at time t20 to t24, and t26 to t28 can be made substantially the same as the operation of the semiconductor memory device at time t0 to t4, and t6 to t8 in the first embodiment.

At time t25, as described above, the sense amplifier module 18 decreases the voltage of the selection gate line SGD in the selection string unit SU from the voltage VS1 to a voltage less than the voltage VSS. This can, for example, reliably put the selection transistor ST1 in the selection string unit SU into an OFF state.

The program operation ends as described above.

Effects equivalent to the effects of the first embodiment and the first modification of the first embodiment are provided also by the second modification of the first embodiment.

2.3 Third Modification of First Embodiment

While an example has been described in the first modification of the first embodiment described above, the row decoder module 17 decreases the voltage of the selection gate line SGD in the selection string unit SU to the voltage VSS at time t15 during the program operation in a similar manner to the first embodiment, the present invention is not limited to this. The row decoder module 17 may decrease the voltage of the selection gate line SGD to a voltage less than the voltage VSS in a similar manner to the second modification of the first embodiment.

A configuration of a semiconductor memory device according to a third modification of the first embodiment can be made substantially the same as the configurations of the semiconductor memory devices according to the first embodiment, the first modification of the first embodiment and the second modification of the first embodiment. Program operation in write operation using the semiconductor memory device according to the third modification of the first embodiment will be mainly described below.

Figure 13:
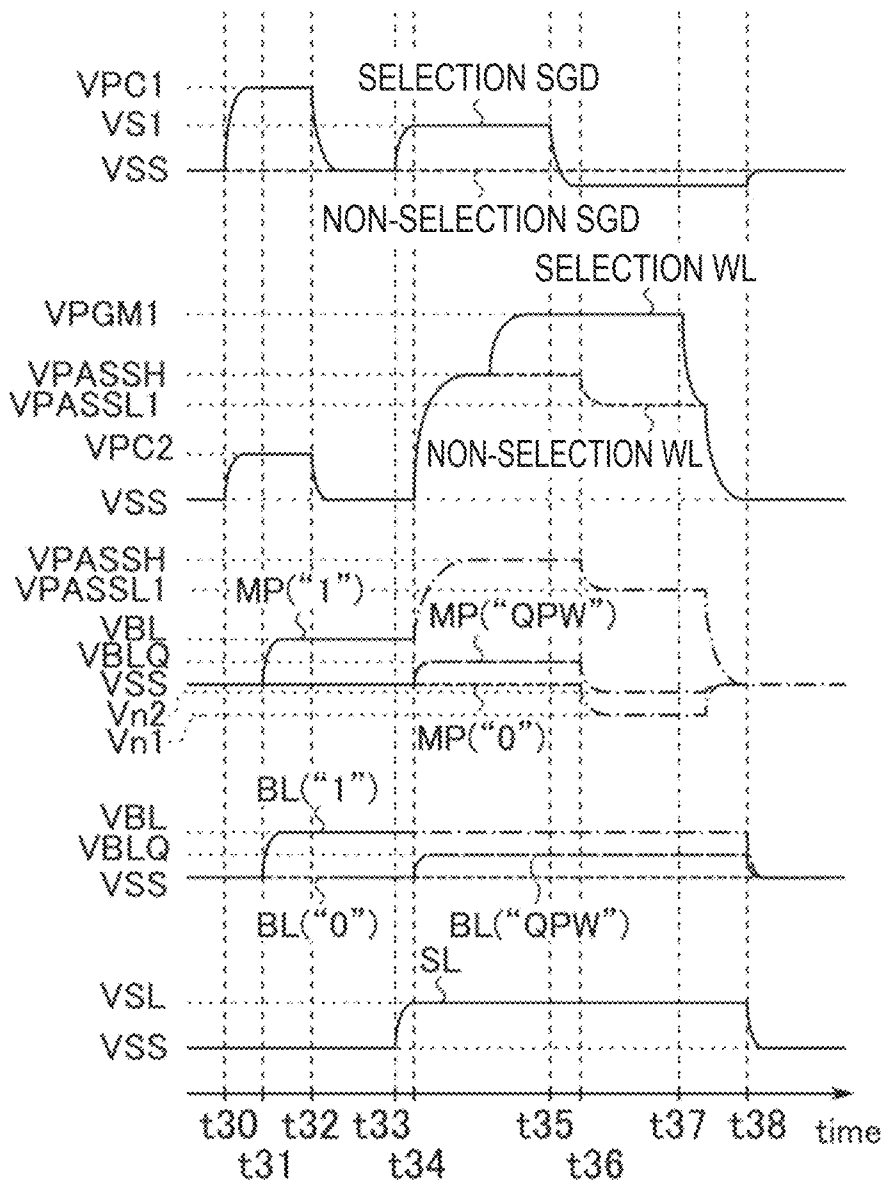
FIG. 13 is a timing chart indicating one example of voltages of a source line, a bit line, a channel of a memory pillar, a word line, and a selection gate line during program operation in write operation using a semiconductor memory device according to a third modification of the first embodiment.

A timing chart during the program operation using the semiconductor memory device 1 according to the third modification of the first embodiment will be described using FIG. 13. FIG. 13 is a timing chart indicating one example of voltages of a source line, a bit line, a channel of a memory pillar, a word line, and a selection gate line during the program operation in the write operation using the semiconductor memory device according to the third modification of the first embodiment.

Operation of the semiconductor memory device 1 at time t30 to t34, and t36 to t38 can be made substantially the same as the operation of the semiconductor memory device at time t10 to t14, and t16 to t18 in the first modification of the first embodiment.

At time t35, as described above, the sense amplifier module 18 decreases the voltage of the selection gate line SGD in the selection string unit SU from the voltage VS1 to a voltage less than the voltage VSS in a similar manner to the operation at time t25 in the second modification of the first embodiment. This can, for example, reliably put the selection transistor ST1 in the selection string unit SU into an OFF state.

The program operation ends as described above.

Effects equivalent to the effects of the first embodiment, the first modification of the first embodiment, and the second modification of the first embodiment can be provided also by the third modification of the first embodiment.

3. Second Embodiment

While examples have been described in the first embodiment, the first modification of the first embodiment, the second modification of the first embodiment, and the third modification of the first embodiment described above where the channel of the memory pillar MP to be subjected to the "0" program operation is put into the floating state by the selection transistor ST, the present invention is not limited to this. For example, each NAND string includes a dummy cell transistor. Further, the channel of the memory pillar MP to be subjected to the "$_0$" program operation may be put into the floating state by the dummy cell transistor.

A configuration and operation of a semiconductor memory device according to a second embodiment will be described below mainly concerning points different from the first embodiment.

3.1 Configuration

A configuration of a memory system including the semiconductor memory device according to the second embodiment can be made similar to the configuration of the memory system including the semiconductor memory device according to the first embodiment. Further, the semiconductor memory device 1 according to the second embodiment includes the memory cell array 10, the input/output circuit 11, the logic control circuit 12, the address register 13, the command register 14, the sequencer 15, the driver module 16, the row decoder module 17, and the sense amplifier module 18 in a similar manner to the semiconductor memory device according to the first embodiment. Configurations of the input/output circuit 11, the logic control circuit 12, the address register 13, the command register 14, the sequencer 15, the driver module 16, the row decoder module 17, and the sense amplifier module 18 of the semiconductor memory device 1 according to the second embodiment can be made substantially the same as the configurations of these according to the first embodiment. Thus, in the following description, a configuration of the memory cell array 10 according to the second embodiment will be described mainly concerning points different from the configuration of the memory cell array according to the first embodiment.

3.1.1 Circuit Configuration of Memory Cell Array

Figure 14:
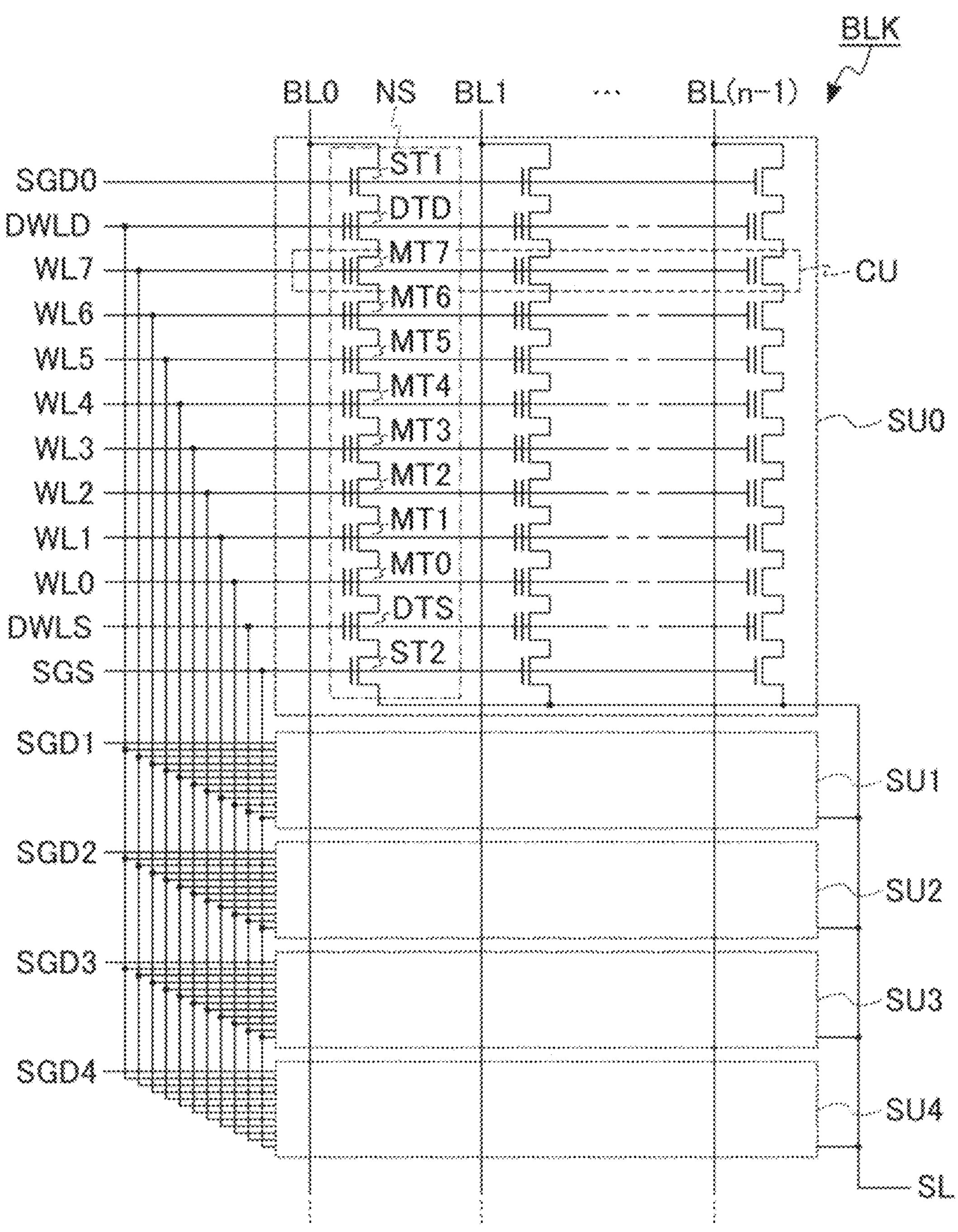
FIG. 14 is a circuit diagram for explaining one example of a configuration of a memory cell array of a semiconductor memory device according to a second embodiment.

The configuration of the memory cell array 10 in the second embodiment will be described using FIG. 14. FIG. 14 is a circuit diagram for explaining one example of the configuration of the memory cell array of the semiconductor memory device according to the second embodiment.

In the second embodiment, each NAND string NS includes, for example, dummy cell transistors DTD and DTS in addition to the eight memory cell transistors MT0 to MT7 and the selection transistors ST1 and ST2. Note that in the following description, in a case where the dummy cell transistors DTD and DTS are not distinguished from each other, each of the dummy cell transistors DTD and DTS will be simply referred to as a dummy cell transistor DT.

A drain of the dummy cell transistor DTD is connected to a source of the selection transistor ST1. A source of the dummy cell transistor DTD is connected to a drain of the memory cell transistor MT7.

A drain of the dummy cell transistor DTS is connected to a source of the memory cell transistor MT0. A source of the dummy cell transistor DTS is connected to a drain of the selection transistor ST2.

A gate of the dummy cell transistor DTD included in each block BLK is connected to a dummy word line DWLD. Further, a gate of the dummy cell transistor DTS included in each block BLK is connected to a dummy word line DWLS. Note that in the following description, in a case where the dummy word lines DWLD and DWLS are not distinguished from each other, each of the dummy word lines DWLD and DWLS will be simply referred to as a dummy word line DWL.

3.1.2 Structure of Memory Cell Array

A structure of the memory cell array 10 of the semiconductor memory device 1 according to the second embodiment will be described using FIG. 15. FIG. 15 is a cross-sectional view for explaining one example of the structure of the memory cell array of the semiconductor memory device according to the second embodiment.

The memory cell array 10 further includes conductive layers 46 and 47 and insulating layer 35 and 36.

The insulating layer 35 is laminated on the conductive layer 42. The conductive layer 46 is laminated on the insulating layer 35. The conductive layer 46 is used as the dummy word line DWLS. The conductive layer 46 includes, for example, tungsten.

Eight insulating layers 32 and eight conductive layers 43 are laminated on the conductive layer 46 in a similar manner to the first embodiment. The insulating layer 36 is laminated on the uppermost conductive layer 43. The conductive layer 47 is laminated on the insulating layer 36. The conductive layer 47 is used as the dummy word line DWLD. The conductive layer 47 includes, for example, tungsten.

The insulating layer 33, the conductive layer 44, the insulating layer 34, and the conductive layer 45 are laminated on the conductive layer 47 in this order in a similar manner to the first embodiment.

Each of the memory pillars MP penetrates through the insulating layers 31 to 33, 35 and 36, and the conductive layers 42 to 44, 46 and 47. A portion at which the memory pillar MP intersects the conductive layer 46 functions as the dummy cell transistor DTS. A portion at which the memory pillar MP intersects the conductive layer 47 functions as the dummy cell transistor DTD.

The member SLT, for example, divides the conductive layers 42 to 44, 46 and 47.

A lower surface of the member SHE is, for example, located between the conductive layer 47 and the conductive layer 44.

3.1.3 Threshold Voltage Distribution of Memory Cell Transistors

Figure 16:
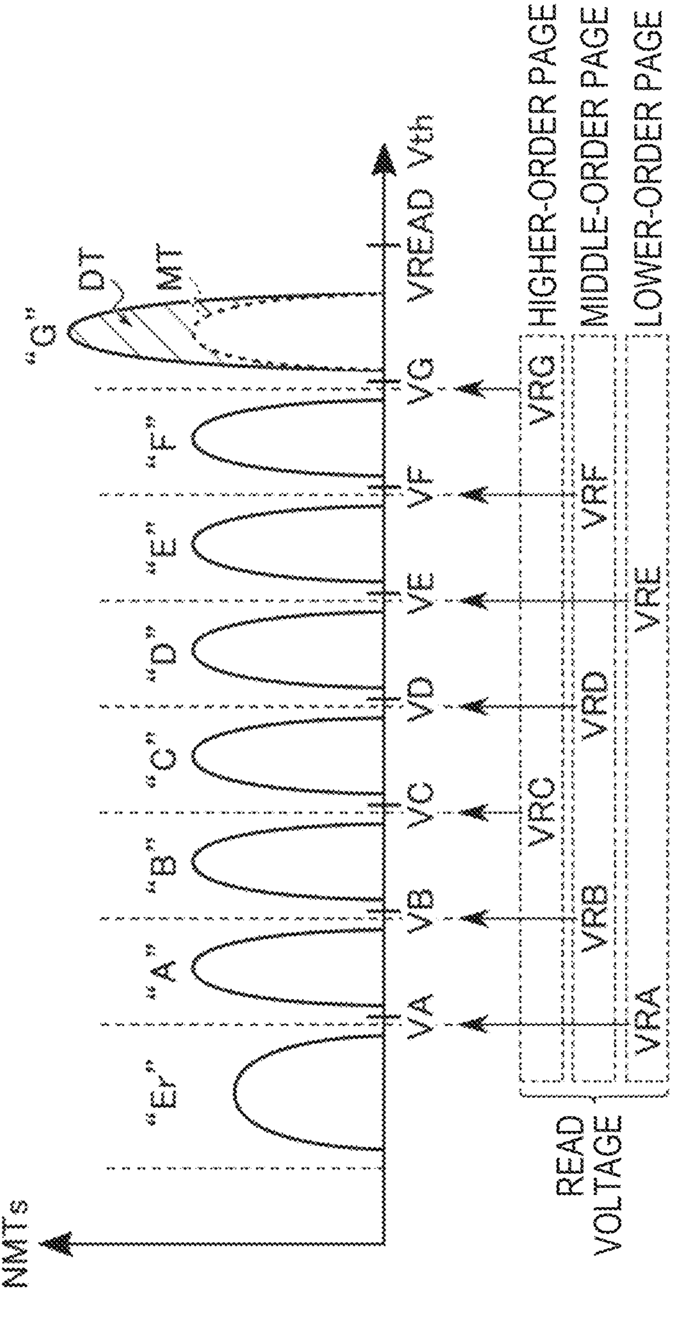
FIG. 16 is a schematic view indicating one example of threshold voltage distribution of memory cell transistors and dummy cell transistors included in the memory cell array of the semiconductor memory device according to the second embodiment.

Threshold voltage distribution of the memory cell transistors MT in the semiconductor memory device 1 according to the second embodiment will be described using FIG. 16. FIG. 16 is a schematic view indicating one example of threshold voltage distribution of the memory cell transistors included in the memory cell array of the semiconductor memory device according to the second embodiment. In the threshold voltage distribution indicated in FIG. 16, a horizontal axis corresponds to a threshold voltage of the memory cell transistors MT and the dummy cell transistors DT. A vertical axis corresponds to the number of the memory cell transistors MT and the dummy cell transistors DT. In FIG. 16, the number of the memory cell transistors MT and the dummy cell transistors DT is indicated as a value NMTs.

The threshold voltage distribution of a plurality of memory cell transistors MT is equivalent to the threshold voltage distribution of the plurality of memory cell transistors MT in the first embodiment. The dummy cell transistors DT have a threshold voltage higher than the threshold voltage of the memory cell transistors MT in an erasure state. The threshold voltage of the dummy cell transistors DT is, for example, equal to or higher than the voltage VRG and less than the voltage VREAD. In other words, the dummy cell transistors DT are, for example, included in the "G" state. In FIG. 16, among the memory cell transistors MT and the dummy cell transistors DT included in the "G" state, the dummy cell transistors DT are indicated by a shaded area.

3.2 Operation

Operation using the semiconductor memory device 1 according to the second embodiment will be described next.

Outline of write operation using the semiconductor memory device 1 according to the second embodiment is similar to outline of the write operation using the semiconductor memory device 1 according to the first embodiment. In the following description, program operation in the write operation using the semiconductor memory device 1 according to the second embodiment will be described using FIG. 17. FIG. 17 is a timing chart indicating one example of voltages of a source line, a bit line, a channel of a memory pillar, a word line, a dummy word line, and a selection gate line during the program operation in the write operation using the semiconductor memory device according to the second embodiment.

At time t40, the row decoder module 17 applies the voltage VPC3 to the dummy word line DWL. Further, the row decoder module 17 applies voltages to the word line WL and the selection gate line SGD in a similar manner to the operation of the semiconductor memory device at time t0 in the first embodiment.

The operation of the semiconductor memory device 1 at time t41 can be made substantially the same as the operation of the semiconductor memory device at time t1 in the first embodiment.

At time t42, the row decoder module 17 decreases the voltage of the dummy word line DWL from the voltage VPC3 to the voltage VSS. Further, the row decoder module 17 decreases the voltages of the word line WL and the selection gate line SGD in a similar manner to the operation of the semiconductor memory device at time t2 in the first embodiment.

The operation of the semiconductor memory device 1 at time t43 can be made the same as the operation of the semiconductor memory device at time t3 in the first embodiment. Through the processing at time t43, the channel of the memory pillar MP ("1") is put into a floating state in which the channel is electrically insulated from the bit line BL and the source line SL in a similar manner to the first embodiment.

At time t44, the row decoder module 17 applies the voltage VPASSH to the dummy word line DWL. Further, the row decoder module 17 applies the voltage to the word line WL in a similar manner to the operation of the semiconductor memory device at time t4 in the first embodiment except that the voltage VPGM2 is applied instead of the voltage VPGM1.

Further, in a similar manner to the first embodiment, the voltage of the channel of the memory pillar MP ("1") increases to the voltage equal to the voltage VPASSH through capacitive coupling between the channel and the word line WL in a similar manner to the non-selection word lines WL.

At time t45, the row decoder module 17 decreases the voltage of the dummy word line DWL from the voltage VPASSH to the voltage VSS. This puts the channel of the memory pillar MP ("0") into a floating state in which the channel is electrically insulated from the bit line BL and the source line SL. Further, the row decoder module 17, for example, decreases the voltage of the selection gate line SGD to the voltage VSS in a similar manner to the operation of the semiconductor memory device at time t5 in the first embodiment.

At time t46, the row decoder module 17 decreases the voltages of the non-selection word lines WL from the voltage VPASSH to a voltage VPASSL2. The voltage VPASSL2 is a voltage lower than the voltage VPASSH by the voltage VC2.

Further, the voltage of the channel of the memory pillar MP ("0") decreases to a voltage equal to a voltage Vn3 (<VSS) through capacitive coupling between the channel and the word line WL. The voltage Vn3 is a voltage lower than the voltage VSS by the voltage VC2. The voltage Vn3 is, for example, a negative voltage. Further, in a similar manner to the first embodiment, the voltage of the channel of the memory pillar MP ("1") decreases to a voltage equal to the voltage VPASSL2 through capacitive coupling between the channel and the word line WL.

As described above, as a result of a potential difference (VPGM2-Vn3) between the selection word line and the channel being large in the NAND string NS corresponding to the bit line BL ("0"), electrons are injected to the charge accumulation layer, and the threshold voltage of the memory cell transistors MT is increased.

Further, as a result of a potential difference between the selection word line and the channel being small in the NAND string NS corresponding to the bit line BL ("1"), few electrons are injected to the charge accumulation layer. By this means, the threshold voltage of the memory cell transistors MT is maintained.

The operation of the semiconductor memory device 1 at time t47 and t48 is similar to the operation of the semiconductor memory device at time t7 and t8 in the first embodiment.

The program operation ends as described above.

Effects equivalent to the effects of the first embodiment, the first modification of the first embodiment, the second modification of the first embodiment, and the third modification of the first embodiment are provided also by the second embodiment.

Further, as a result of the dummy cell transistor DT having a threshold voltage higher than the threshold voltage in the erasure state, the voltage of the channel of the memory pillar MP ("0") can be decreased. To supplement this, as a result of the threshold voltage of the dummy cell transistor DT being higher than the threshold voltage in the erasure state, it is possible to prevent the dummy cell transistor DT from being put into an ON state, for example, when the voltage of the channel of the memory pillar MP ("0") decreases at time t46. In other words, the channel of the memory pillar MP ("0") can be maintained in the floating state. Also according to such a configuration, it is possible to prevent increase in a write voltage.

4. Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:

a first memory string in which a plurality of memory cells including a first memory cell and a second memory cell are connected in series;

a first word line connected to a gate of the first memory cell, the first word line having a capacitive coupling with a channel of the first memory cell;

a second word line connected to a gate of the second memory cell, the second word line having a capacitive coupling with a channel of the second memory cell;

a first bit line connected to a first end of the first memory string;

a source line connected to a second end of the first memory string;

a first selection transistor provided between the first bit line and a first end of the plurality of memory cells;

a second selection transistor provided between the source line and a second end of the plurality of memory cells;

a first gate line connected to a gate of the first selection transistor; and control circuitry configured to, in performing a program operation on the first memory cell;

at a first timing, apply a third voltage to the first gate line, a write voltage to the first word line, and a first voltage that is less than the write voltage to the second word line;

at a second timing after the first timing, decrease a voltage of the first gate line from the third voltage to a fourth voltage to thereby place a channel of the first memory string into a floating state in which the channel is electrically insulated from the first bit line and the source line; and decrease the voltage of the second word line from the first voltage to a second voltage that is less than the first voltage after placing the channel of the first memory string into the floating state, the decrease of the voltage of the second word line from the first voltage to the second voltage causing a voltage of the channel of the first memory string to decrease to be less than a ground voltage through capacitive coupling between the channel and the second word line.

2. The semiconductor memory device of claim 1, further comprising:

a second memory string in which a plurality of memory cells including a third memory cell and a fourth memory cell are connected in series; and a second bit line connected to a first end of the second memory string.

3. The semiconductor memory device of claim 2, wherein the first word line is connected to a gate of the third memory cell, the second word line is connected to a gate of the fourth memory cell, and the source line is connected to a second end of the second memory string.

4. The semiconductor memory device of claim 3, the control circuitry is configured to, in performing a program operation on the first memory cell, decrease a voltage of the second word line from the first voltage to the second voltage while placing a channel of the second memory string into the floating state.

5. The semiconductor memory device of claim 4, wherein a voltage of the channel of the second memory string becomes less than the first voltage when the control circuitry decreases the voltage of the second word line to the second voltage.

6. The semiconductor memory device of claim 1, wherein a threshold voltage of the first selection transistor and a threshold voltage of the second selection transistor are higher than a threshold voltage of the plurality of memory cells in an erasure state.

7. The semiconductor memory device of claim 1, wherein the control circuitry is configured to, in performing a program operation on the first memory cell, make a voltage of the first gate line less than a ground voltage when the control circuitry places the first memory string into the floating state.

8. The semiconductor memory device of claim 1, further comprising:

a dummy cell transistor provided between the first selection transistor and a first end of the plurality of memory cells; and a dummy word line connected to a gate of the dummy cell transistor.

9. The semiconductor memory device of claim 8, wherein a threshold voltage of the dummy cell transistor is higher than a threshold voltage of the plurality of memory cells in an erasure state.

10. The semiconductor memory device of claim 1, wherein the control circuitry is further configured to apply a voltage greater than the ground voltage to the source line when the control circuitry applies the third voltage to the first gate line.

11. The semiconductor memory device of claim 1, wherein the control circuitry is further configured to increase the write voltage applied to the first word line in each successive program loop of a plurality of program loops in a write operation.

12. The semiconductor memory device of claim 1, wherein a voltage of the channel of the first memory string is substantially equal to the ground voltage before the control circuitry decreases the voltage of the second word line from the first voltage to the second voltage.

13. A semiconductor memory device comprising:

a first memory string including a first memory cell and a second memory cell connected in series;

a first word line connected to a gate of the first memory cell, the first word line having a capacitive coupling with a channel of the first memory cell;

a second word line connected to a gate of the second memory cell, the second word line having a capacitive coupling with a channel of the second memory cell;

a first bit line connected to a first end of the first memory string;

a source line connected to a second end of the first memory string;

a first selection transistor provided between the first bit line and a first end of the first memory string;

a second selection transistor provided between the source line and a second end of the first memory string;

a first gate line connected to a gate of the first selection transistor; and circuitry configured to perform control to, in performing a program operation on the first memory cell;

at a first timing, apply a third voltage to the first gate line, a write voltage to the first word line, and a first voltage that is less than the write voltage to the second word line;

at a second timing after the first timing, decrease a voltage of the first gate line from the third voltage to a fourth voltage to thereby cause a channel of the first memory string to be in a floating state in which the channel is electrically insulated from the first bit line and the source line; and decrease the voltage of the second word line from the first voltage to a second voltage that is less than the first voltage after placing the channel of the first memory string into the floating state, the decrease of the voltage of the second word line from the first voltage to the second voltage causing a voltage of the channel of the first memory string to decrease to be less than a ground voltage through capacitive coupling between the channel and the second word line.

14. The semiconductor memory device of claim 13, wherein a threshold voltage of the first selection transistor and a threshold voltage of the second selection transistor are higher than a threshold voltage of the plurality of memory cells in an erasure state.

15. The semiconductor memory device of claim 13, wherein the circuitry is configured to perform control to decrease a voltage of a second word line of a second memory string from the first voltage to the second voltage while placing a channel of the second memory string into the floating state.

16. The semiconductor memory device of claim 13, wherein the circuitry includes a central processing unit (CPU) configured to perform control to program a memory cell array.

17. The semiconductor memory device of claim 13, further comprising:

a dummy cell transistor provided between the first selection transistor and a first end of the first memory string; and a dummy word line connected to a gate of the dummy cell transistor.

18. The semiconductor memory device of claim 13, wherein the circuitry is further configured to perform control to apply a voltage greater than the ground voltage to the source line when the circuitry applies the third voltage to the first gate line.

19. A method performed by a semiconductor memory device comprising a first word line having a capacitive coupling with a channel of a first memory cell, a second word line having a capacitive coupling with a channel of a second memory cell, a first selection transistor, a second selection transistor, and a first gate line connected to a gate of the first selection transistor, the method comprising:

at a first timing, applying a third voltage to the first gate line, a write voltage to the first word line, and a first voltage that is less than the write voltage to the second word line;

at a second timing after the first timing, decreasing a voltage of the first gate line from the third voltage to a fourth voltage to thereby cause a channel of a first memory string including the first memory cell and the second memory cell connected in series to be in a floating state in which the channel is electrically insulated from a first bit line connected to a first end of the first memory string and a source line connected to a second end of the first memory string; and decreasing the voltage of the second word line from the first voltage to a second voltage that is less than the first voltage after placing the channel of the first memory string into the floating state, the decrease of the voltage of the second word line from the first voltage to the second voltage causing a voltage of the channel of the first memory string to decrease to be less than a ground voltage through capacitive coupling between the channel and the second word line.

20. The method of claim 19, further comprising:

increasing the write voltage applied to the first word line in each successive program loop of a plurality of program loops in a write operation.

* * * * *